(12) United States Patent
Ishida

(10) Patent No.: US 9,997,535 B2
(45) Date of Patent: Jun. 12, 2018

(54) SEMICONDUCTOR MEMORY DEVICE AND METHOD OF MANUFACTURING THE SAME

(71) Applicant: Toshiba Memory Corporation, Minato-ku (JP)

(72) Inventor: Takashi Ishida, Yokkaichi (JP)

(73) Assignee: TOSHIBA MEMORY CORPORATION, Minato-ku (JP)

( * ) Notice: Subject to any disclaimer, the term of this patent is extended or adjusted under 35 U.S.C. 154(b) by 0 days. days.

(21) Appl. No.: 15/237,984

(22) Filed: Aug. 16, 2016

(65) Prior Publication Data

US 2017/0271356 A1   Sep. 21, 2017

Related U.S. Application Data

(60) Provisional application No. 62/310,009, filed on Mar. 18, 2016.

(51) Int. Cl.

| H01L 29/76 | (2006.01) |
|---|---|
| H01L 27/11582 | (2017.01) |
| H01L 27/11556 | (2017.01) |
| H01L 29/51 | (2006.01) |
| H01L 29/49 | (2006.01) |

(Continued)

(52) U.S. Cl.
CPC .... *H01L 27/11582* (2013.01); *H01L 21/0223* (2013.01); *H01L 21/28273* (2013.01); *H01L 21/28282* (2013.01); *H01L 27/11556* (2013.01); *H01L 29/4991* (2013.01); *H01L 29/511* (2013.01); *H01L 29/517* (2013.01)

(58) Field of Classification Search
CPC ................................................. H01L 27/11582
See application file for complete search history.

(56) References Cited

U.S. PATENT DOCUMENTS 8,304,352 B2 * 11/2012 Tanaka .............. H01L 21/28282
257/E21.18
8,476,696 B2   7/2013 Komiya
(Continued)

FOREIGN PATENT DOCUMENTS

| JP | 2010-161154 | 7/2010 |
|---|---|---|
| JP | 2013-69953 | 4/2013 |

(Continued)

*Primary Examiner* — Jamie C Niesz
(74) *Attorney, Agent, or Firm* — Oblon, McClelland, Maier & Neustadt, L.L.P.

(57) ABSTRACT

According to an embodiment, a semiconductor memory device comprises: control gate electrodes stacked above a substrate; a semiconductor layer that extends in a first direction above the substrate and faces the control gate electrodes; and a gate insulating layer provided between these control gate electrode and semiconductor layer. The gate insulating layer comprises: a first insulating layer covering a side surface of the semiconductor layer; a charge accumulation layer covering a side surface of this first insulating layer; and a second insulating layer including a metal oxide and covering a side surface of this charge accumulation layer. The charge accumulation layer has: a first portion facing the control gate electrode; and a second portion facing a region between control gate electrodes adjacent in the first direction and including more oxygen than the first portion.

6 Claims, 22 Drawing Sheets

(51) Int. Cl.
*H01L 21/28* (2006.01)
*H01L 21/02* (2006.01)

(56) References Cited

U.S. PATENT DOCUMENTS

| | | | |
|---|---|---|---|
| 9,524,984 B1* | 12/2016 | Lee | H01L 27/1157 |
| 9,666,593 B2* | 5/2017 | Pang | H01L 29/66666 |
| 2011/0018047 A1* | 1/2011 | Komiya | H01L 27/11521 |
| | | | 257/315 |
| 2012/0132981 A1 | 5/2012 | Imamura et al. | |
| 2014/0291751 A1* | 10/2014 | Lee | H01L 29/792 |
| | | | 257/324 |
| 2015/0263126 A1* | 9/2015 | Shingu | H01L 29/518 |
| | | | 257/321 |
| 2016/0079269 A1* | 3/2016 | Sekine | H01L 27/11582 |
| | | | 257/314 |

FOREIGN PATENT DOCUMENTS

| | | |
|---|---|---|
| JP | 5398388 | 1/2014 |
| JP | 5566845 | 8/2014 |

\* cited by examiner

SEMICONDUCTOR MEMORY DEVICE AND METHOD OF MANUFACTURING THE SAME

CROSS-REFERENCE TO RELATED APPLICATIONS

This application is based upon and claims the benefit of U.S. Provisional Patent Application No. 62/310,009, filed on Mar. 18, 2016, the entire contents of which are incorporated herein by reference.

FIELD

Embodiments described herein relate to a semiconductor memory device and a method of manufacturing the same.

BACKGROUND

Description of the Related Art

A flash memory that stores data by accumulating a charge in a charge accumulation layer, is known. Such a flash memory is connected by a variety of systems such as NAND type or NOR type, and configures a semiconductor memory device. In recent years, a semiconductor memory device in which memory cells are disposed three-dimensionally (three-dimensional type semiconductor memory device) has been proposed to raise integration level.

DETAILED DESCRIPTION

A semiconductor memory device according to an embodiment comprises: a plurality of control gate electrodes stacked above a substrate; a semiconductor layer that extends in a first direction above the substrate and faces the plurality of control gate electrodes; and a gate insulating layer provided between these control gate electrode and semiconductor layer. The gate insulating layer comprises: a first insulating layer covering a side surface of the semiconductor layer; a charge accumulation layer covering a side surface of this first insulating layer; and a second insulating layer including a metal oxide and covering a side surface of this charge accumulation layer. The charge accumulation layer has a first portion that faces the control gate electrode and a second portion that faces a region between control gate electrodes adjacent in the first direction and including more oxygen than the first portion.

Next, nonvolatile semiconductor memory devices according to embodiments will be described in detail with reference to the drawings. Note that these embodiments are merely examples, and are not shown with the intention of limiting the present invention.

For example, the nonvolatile semiconductor memory devices described below each comprise a plurality of memory cells (memory transistors) arranged linearly in a first direction above a substrate. These memory cells each include: a semiconductor layer that extends in the above-described first direction and functions as a channel body; and a control gate electrode provided, via a gate insulating layer, on a side surface of the semiconductor layer.

These plurality of memory cells configure a memory string. One memory string may include one semiconductor layer, or may include two or more semiconductor layers joined at their one ends (lower ends).

In addition, the above-described memory cell may be a MONOS (Metal-Oxide-Nitride-Oxide-Semiconductor) type memory cell that includes: a charge accumulation layer configured from a nitride; and a control gate electrode made of a metal, or may be a SONOS (Semiconductor-Oxide-Nitride-Oxide-Semiconductor) type memory cell that includes a control gate electrode made of a semiconductor.

Moreover, the above-described gate insulating layer may include a floating gate, not the charge accumulation layer configured from a nitride. As for a memory cell including a floating gate, refer to U.S. patent application Ser. No. 13/112,345 whose disclosure content is herewith incorporated by this reference.

Moreover, each of the drawings of the nonvolatile semiconductor memory devices employed in the embodiments below is schematic, and thicknesses, widths, ratios, and so on, of layers are different from those of the actual nonvolatile semiconductor memory devices.

First Embodiment

[Semiconductor Memory Device]

Figure 1:
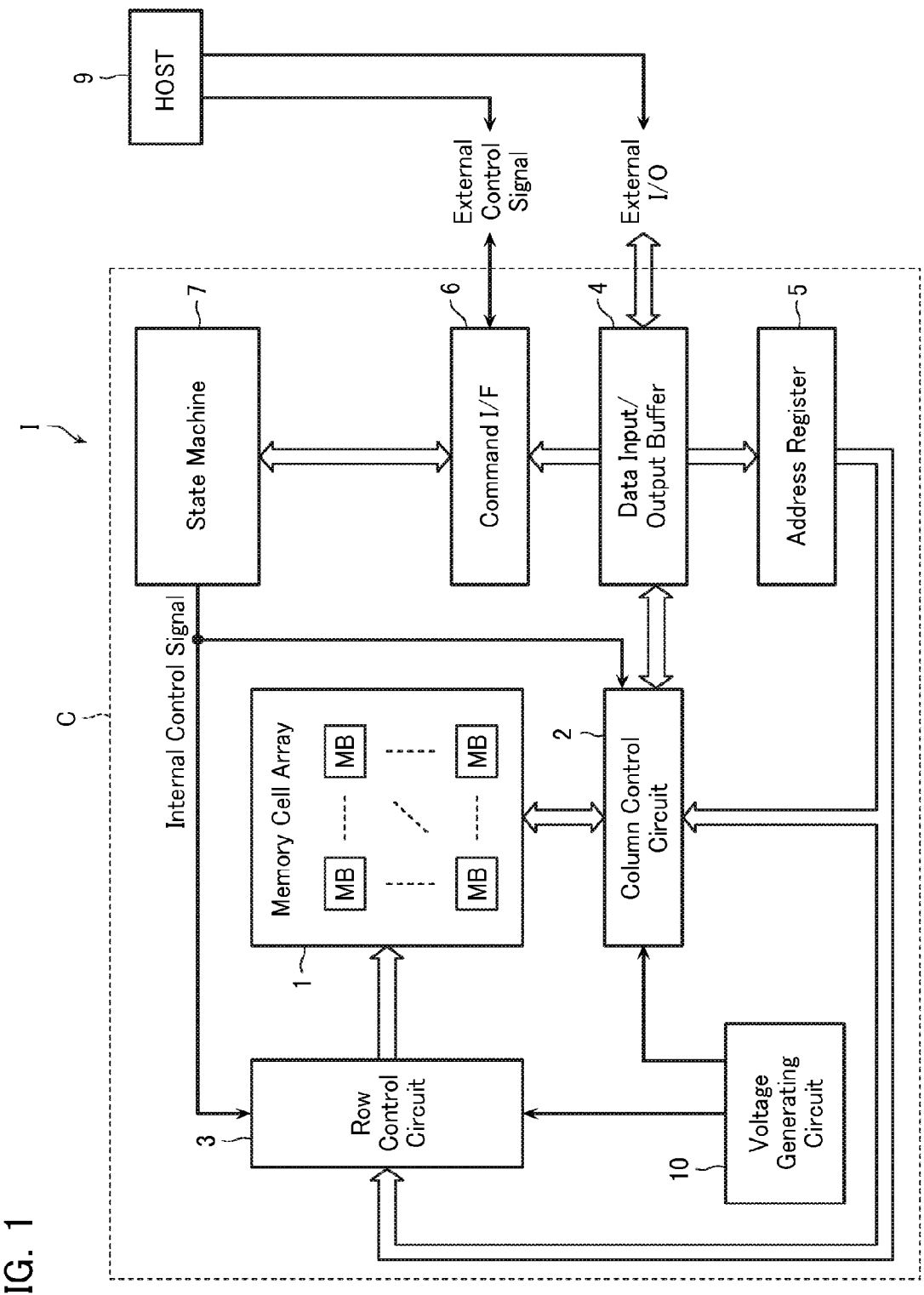
FIG. 1 is a block diagram of a nonvolatile semiconductor memory device according to a first embodiment.

FIG. 1 is a block diagram of a nonvolatile semiconductor memory device according to a first embodiment. Note that the nonvolatile semiconductor memory device referred to herein means, for example, the likes of a chip C storing user data or an electronic device I (for example, a smartphone, a mobile phone, a tablet terminal, a music player, a wearable terminal, and so on) installed with this chip C. Moreover, user data refers to, for example, data expressing contents (a character string, a sound, an image, a moving picture, and so on) utilized by a user, and is expressed by a combination of "0"s and "1"s.

The electronic device I comprises: the chip C; and a host 9 controlling this chip C. The chip C comprises: a memory cell array 1; and a column control circuit 2, a row control circuit 3, a data input/output buffer 4, an address register 5, a command interface 6, a state machine 7, and a voltage generating circuit 10 that control this memory cell array 1. The memory cell array 1 comprises a plurality of memory blocks MB. These memory blocks MB each record user data. The column control circuit 2 comprises an unillustrated sense amplifier, and performs read of user data, and so on. Moreover, the column control circuit 2, when performing write of user data, transfers a voltage to the memory cell array 1, according to inputted user data. The row control circuit 3 specifies a position for performing read or write of user data in the memory cell array 1, according to inputted address data. The data input/output buffer 4 performs input/output control of user data, address data, and command data. The address register 5 stores address data and supplies the address data to the column control circuit 2 and the row control circuit 3. The state machine 7 receives an external control signal from the host 9, via the command interface 6, and inputs an internal control signal to the column control circuit 2 and the row control circuit 3. The voltage generating circuit 10 generates a voltage and supplies the voltage to the column control circuit 2 and the row control circuit 3.

Figure 2:
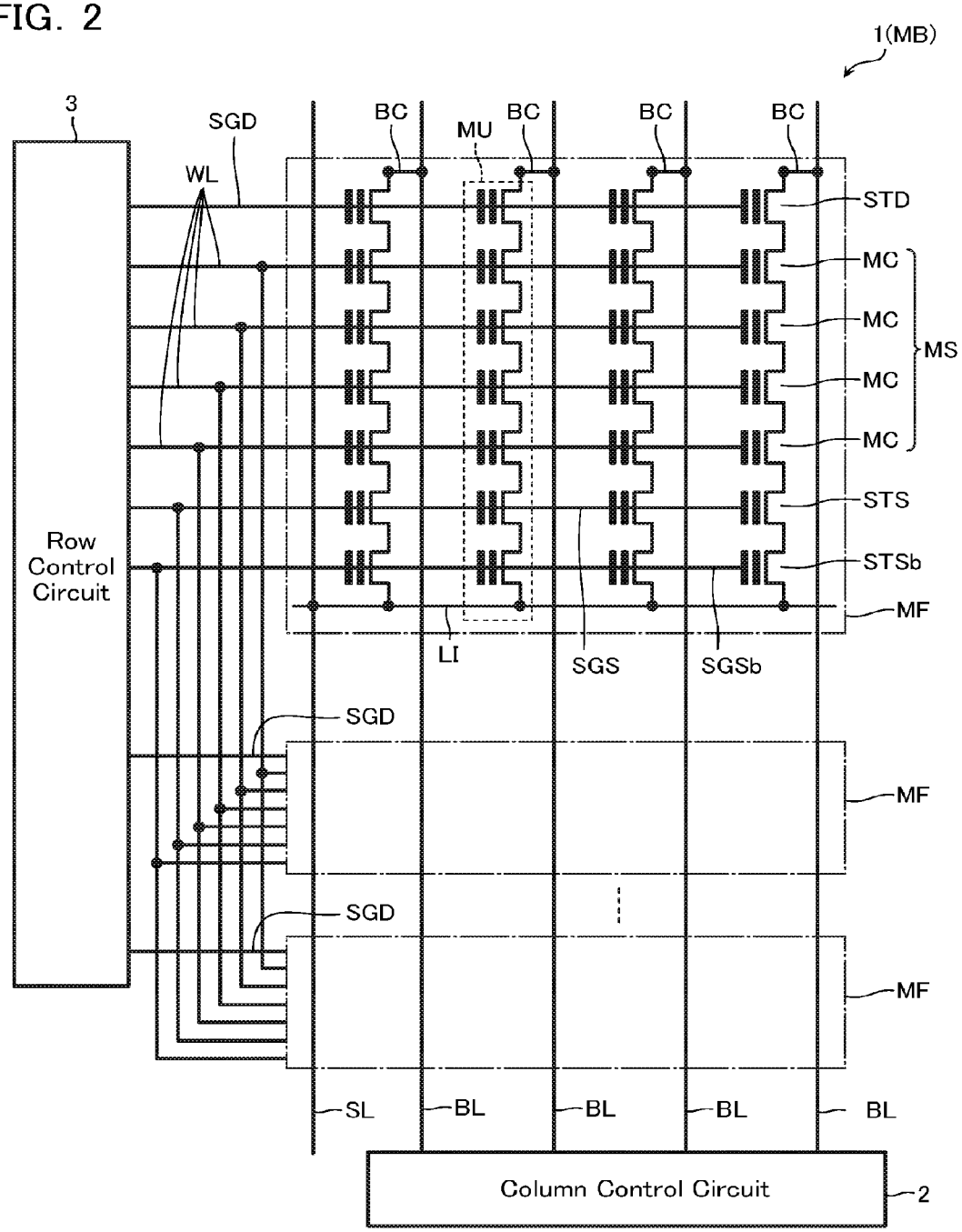
FIG. 2 is a circuit diagram showing a configuration of part of the same nonvolatile semiconductor memory device.

FIG. 2 is an equivalent circuit diagram showing a configuration of the memory block MB configuring the memory cell array 1. The memory block MB is connected to the column control circuit 2 via bit lines BL, to the row control circuit 3 via word lines WL, and to an unillustrated source line driver via a source line SL.

The memory block MB comprises a plurality of memory fingers MF. The memory finger MF comprises a plurality of memory units MU. One ends of these plurality of memory units MU are connected to the bit lines BL via bit line contacts BC. Moreover, the other ends of these plurality of memory units MU are connected to the source line SL via a common source contact LI. The memory unit MU comprises a drain side select gate transistor STD, a memory string MS, a source side select gate transistor STS, and a lowermost layer source side select gate transistor STSb that are connected in series between the bit line contact BC and the source contact LI.

The memory string MS comprises a plurality of memory cells MC connected in series. The memory cell MC is a field effect transistor that comprises: a semiconductor layer functioning as a channel body; a gate insulating layer capable of accumulating a charge; and a control gate electrode, and stores a one-bit portion or a multiple-bit portion of data configuring user data. A threshold voltage of the memory cell MC changes according to a charge amount in the gate insulating layer. Note that the control gate electrodes of the plurality of memory cells MC belonging to an identical memory string MS have the word lines WL respectively connected thereto. The word line WL is provided commonly for all of the memory strings MS in the memory block MB.

The drain side select gate transistor STD, the source side select gate transistor STS, and the lowermost layer source side select gate transistor STSb are field effect transistors that comprise: a semiconductor layer functioning as a channel body; and a control gate electrode. Connected to the plurality of drain side select gate transistors STD belonging to an identical memory finger MF is a common drain side select gate line SGD. Moreover, connected to the control gate electrodes of the pluralities of source side select gate transistors STS and lowermost layer source side select gate transistors STSb belonging to an identical memory block MB are, respectively, a common source side select gate line SGS and a common lowermost layer source side select gate line SGSb.

Note that in the description below, the lowermost layer source side select gate transistor STSb, the source side select gate transistor STS, and the drain side select gate transistor STD will sometimes simply be called select gate transistors (STSb, STS, and STD). Moreover, the lowermost layer source side select gate line SGSb, the source side select gate line SGS, and the drain side select gate line SGD will sometimes simply be called select gate lines (SGSb, SGS, and SGD).

Figure 3:
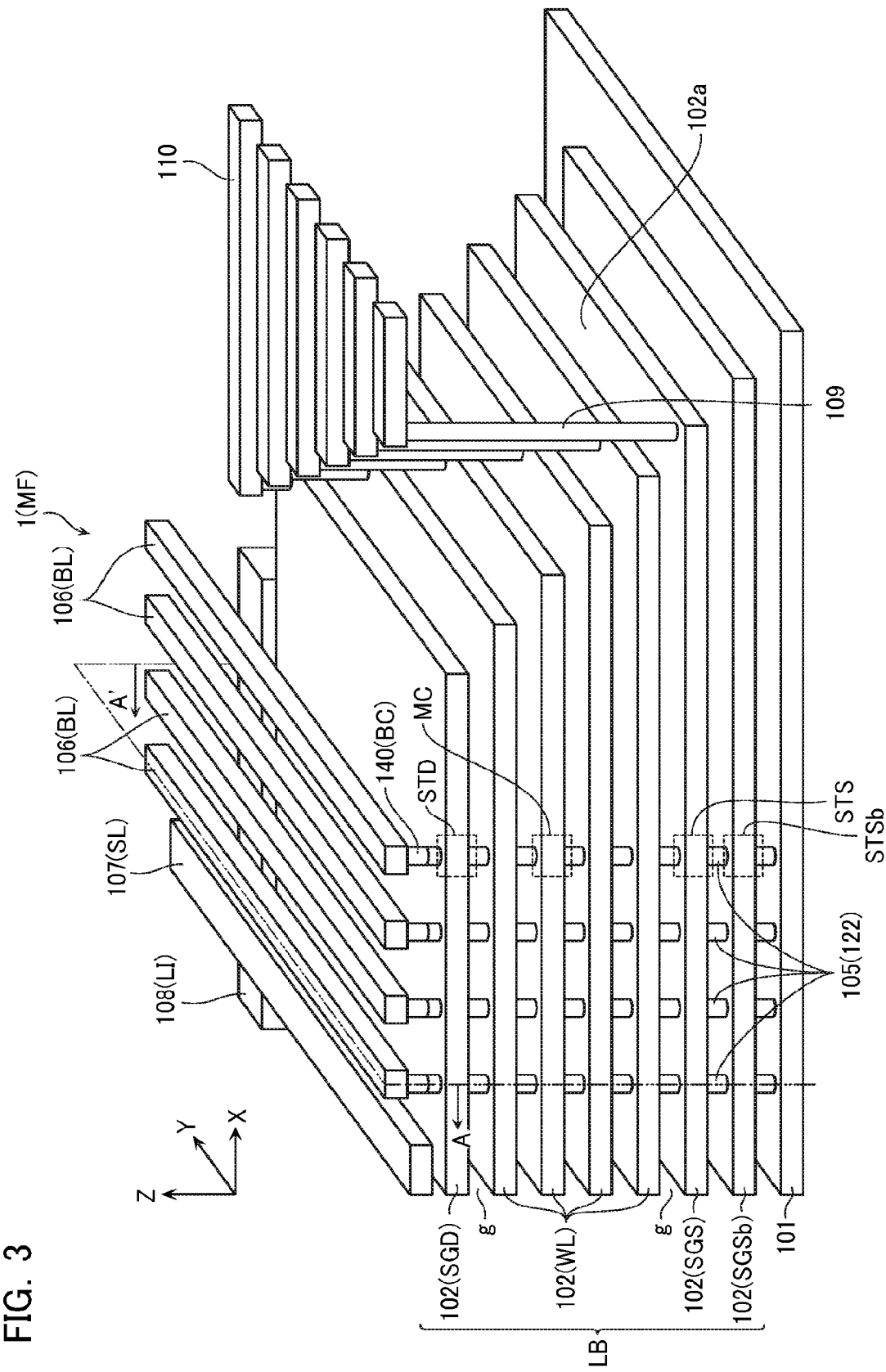
FIG. 3 is a perspective view showing a configuration of part of the same nonvolatile semiconductor memory device.

FIG. 3 is a schematic perspective view showing a configuration of part of the memory finger MF. Note that FIG. 3 explains a three-dimensional structure of a wiring line or the memory cell MC, and so on, and does not illustrate an inter-layer insulating layer provided between the wiring lines, and so on. In addition, FIG. 3 is illustrated for explanation, and a specific configuration may be appropriately changed. Moreover, in the description below, a certain direction parallel to a surface of a substrate 101 is assumed to be an X direction, a direction parallel to the surface of the substrate 101 and perpendicular to the X direction is assumed to be a Y direction, and a direction perpendicular to the surface of the substrate 101 is assumed to be a Z direction. The description below exemplifies the case where a direction in which the memory string MS extends (first direction) matches the Z direction, but the first direction need not match the Z direction. Furthermore, in the description below, a surface of an object facing the substrate 101 is assumed to be a lower surface of the object, a surface opposite to the lower surface of the object is assumed to be an upper surface, and a surface facing a direction crossing the first direction is assumed to be a side surface. Additionally, a direction approaching the substrate is assumed to be downward, and a direction going away from the substrate is assumed to be upward.

The memory finger MF comprises: the substrate 101; a stacked body LB provided above the substrate 101; and a substantially circular column-shaped memory columnar body 105 whose side surface is covered by the stacked body LB.

The substrate 101 is a semiconductor substrate configured from the likes of monocrystalline silicon (Si), for example. The substrate 101 comprises a double well structure that includes an N type impurity layer on a surface of a semiconductor substrate and that further includes a P type impurity layer in this N type impurity layer, for example. This P type impurity layer is shown in the drawings. The substrate 101 (P type impurity layer) functions as a channel body of a transistor that has as its control gate electrode a lowermost layer conductive layer 102 in the stacked body LB and that electrically connects the memory columnar body 105 and a conductive layer 108.

The stacked body LB includes a plurality of conductive layers 102 stacked above the substrate 101 via a gap g. These conductive layers 102 respectively function as the word line WL and control gate electrode of the memory cell MC, or as the select gate lines (SGSb, SGS, and SGD) and control gate electrodes of the select gate transistors (STSb, STS, and STD). The conductive layer 102 is configured from a conductive layer of the likes of tungsten (W), for example. In addition, each of the conductive layers 102 comprises a contact part 102a projecting in the X direction with respect to the conductive layer 102 positioned in a layer above it, and is connected to the row control circuit 3 (FIGS. 1 and 2) via a via contact wiring line 109 connected to a surface of this contact part 102a and via a wiring line 110. Note that the via contact wiring line 109 and the wiring line 110 are configured from a conductive layer of the likes of tungsten (W). Note that in FIG. 3, the stacked body LB includes seven conductive layers 102, but the number of conductive layers 102 in the stacked body LB may be appropriately changed.

The memory columnar body 105, along with the stacked body LB, configures the memory string MS, and so on. That is, an intersection of the conductive layer 102 and the memory columnar body 105 functions as the memory cell MC or the select gate transistor (STSb, STS, or STD). The memory columnar body 105 includes a substantially circular column-shaped semiconductor layer 122 extending in the Z direction. The semiconductor layer 122 faces the plurality of conductive layers 102 and functions as a channel body of the memory cells MC and the select gate transistors (STSb, STS, and STD). A lower end of the semiconductor layer 122 is connected to the unillustrated source line driver, via the substrate 101, the conductive layer 108 functioning as the source contact LI, and a conductive layer 107 which is provided above the conductive layer 108 and functions as the source line SL. An upper end of the semiconductor layer 122 is connected to the column control circuit 2 (FIGS. 1 and 2) via a conductive layer 140 which functions as the bit line contact BC and a conductive layer 106 which functions as the bit line BL. Note that the conductive layer 106, the conductive layer 107, the conductive layer 108, and the conductive layer 140 are configured from a conductive layer of the likes of tungsten (W). Moreover, the conductive layer 106 and the conductive layer 107 are arranged in plurality in the X direction and extend in the Y direction. The conductive layer 108 comprises a substantially plate-like shape extending in the X direction and the Z direction along a side surface of the stacked body LB. The conductive layer 108 is connected at its lower end to the substrate 101.

Figure 4:
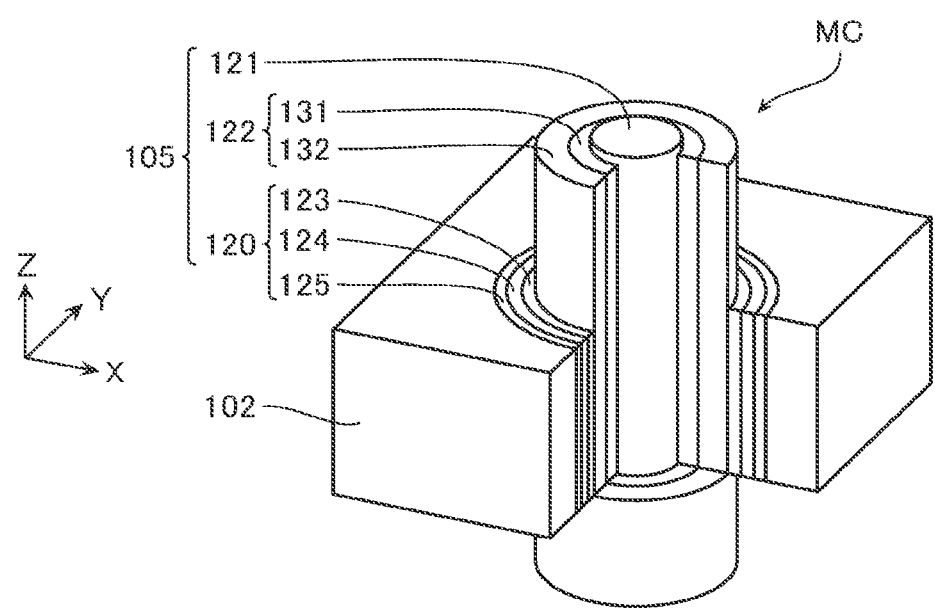
FIG. 4 is a perspective view showing a configuration of part of the same nonvolatile semiconductor memory device.

FIG. 4 is a schematic perspective view showing a configuration of the memory cell MC. Note that FIG. 4 shows the configuration of the memory cell MC, but the select gate transistors (STSb, STS, and STD) may also be configured similarly to the memory cell MC. Note that in FIG. 4, part of the configuration is omitted.

The memory cell MC is provided at an intersection of the conductive layer 102 and the memory columnar body 105. The memory columnar body 105 comprises: a circular column-shaped core insulating layer 121 extending in the Z direction; the semiconductor layer 122 covering a side surface of the core insulating layer 121; and a gate insulating layer 120 provided between this semiconductor layer 122 and the conductive layer 102. The semiconductor layer 122 comprises: a first semiconductor layer 131 covering the side surface of the core insulating layer 121; and a second semiconductor layer 132 covering a side surface of this first semiconductor layer 131. The gate insulating layer 120 comprises: a tunnel insulating layer 123 covering a side surface of the semiconductor layer 122; a charge accumulation layer 124 covering a side surface of the tunnel insulating layer 123; and a block insulating layer 125 covering a side surface of the charge accumulation layer 124. Note that the semiconductor layer 122 (first semiconductor layer 131 and second semiconductor layer 132) and the gate insulating layer 120 (tunnel insulating layer 123, charge accumulation layer 124, and block insulating layer 125) are formed in a substantially cylindrical shape extending in the Z direction along the side surface of the core insulating layer 121.

The core insulating layer 121 is configured from an insulating layer of the likes of silicon oxide ($SiO_2$), for example. The semiconductor layer 122 (first semiconductor layer 131 and second semiconductor layer 132) is configured from a semiconductor layer of the likes of polysilicon, for example.

Figure 5:
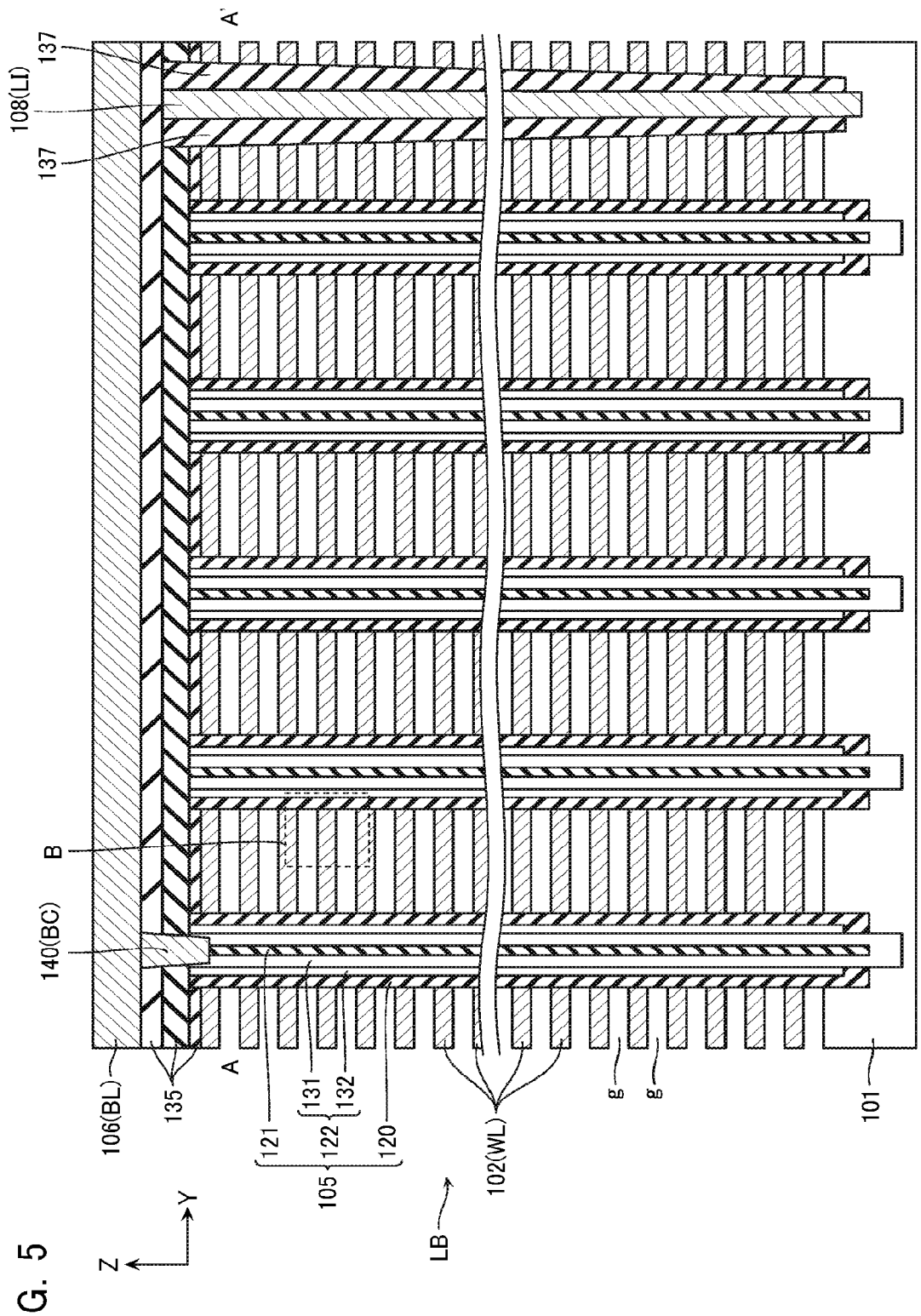
FIG. 5 is a cross-sectional view showing a configuration of part of the same nonvolatile semiconductor memory device.

FIG. 5 is a cross-sectional view of the configuration shown in FIG. 3 cut by a plane including the two dot-chain line in FIG. 3 and viewed along a direction of the arrows A and A'. A and A' in FIG. 5 respectively correspond to positions where the arrows A and A' in FIG. 3 are provided. Note that, in FIG. 5, the stacked body LB includes more conductive layers 102 than in FIG. 3. Moreover, FIG. 5 illustrates the five memory columnar bodies 105 most closely adjacent to the source contact LI. Furthermore, FIG. 5 is illustrated for explanation, and a specific configuration may be appropriately changed.

Although omitted in FIG. 3 for convenience of description, a spacer insulating layer 137 is provided between the conductive layer 102 and the conductive layer 108. The spacer insulating layer 137 is configured from an insulating layer of the likes of silicon oxide ($SiO_2$) and secures insulation between the conductive layer 102 and the conductive layer 108. Moreover, inter-layer insulating layers 135 are provided between the stacked body LB and the conductive layer 106. The inter-layer insulating layer 135 is configured from an insulating layer of the likes of silicon oxide ($SiO_2$) and secures insulation between the conductive layer 102 and the conductive layer 106.

Figure 6:
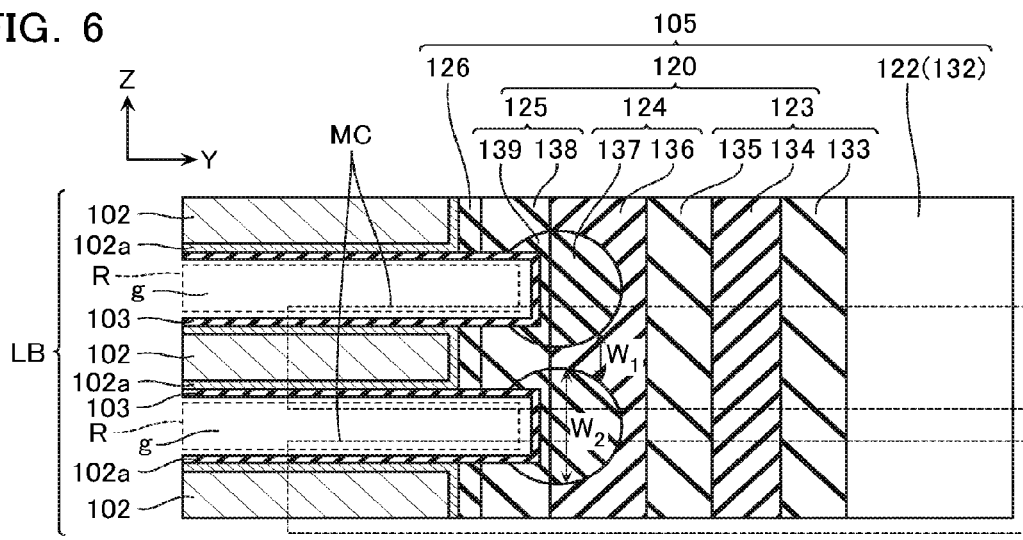
FIG. 6 is a cross-sectional view showing a configuration of part of the same nonvolatile semiconductor memory device.

FIG. 6 is an enlarged view of the portion indicated by B in FIG. 5. Note that FIG. 6 illustrates a film configuration of the gate insulating layer 120 in more detail. Moreover, FIG. 6 illustrates the likes of a barrier metal layer 102a and a cover insulating layer 126 that were omitted in FIG. 5. Furthermore, FIG. 6 is illustrated for explanation, and a specific configuration may be appropriately changed.

As described with reference to FIG. 4, the gate insulating layer 120 according to the present embodiment comprises the tunnel insulating layer 123, the charge accumulation layer 124, and the block insulating layer 125. In addition, the gate insulating layer 120 contacts the stacked body LB via the cover insulating layer 126.

The tunnel insulating layer 123 is configured from a stacked structure of an insulating layer 133 configured from silicon oxide ($SiO_2$), an insulating layer 134 configured from silicon nitride ($Si_3N_4$), and an insulating layer 135 configured from silicon oxide ($SiO_2$).

Figure 7:
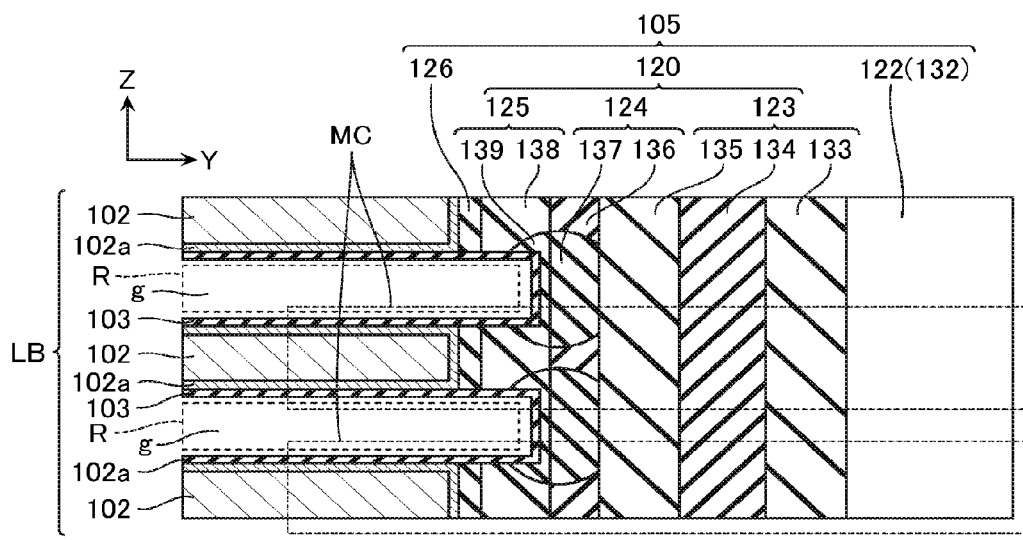
FIG. 7 is a cross-sectional view showing a modified example of the same nonvolatile semiconductor memory device.

The charge accumulation layer 124 comprises: a first portion 136 facing the conductive layer 102; and a second portion 137 facing a region R between conductive layers 102 adjacent in the Z direction. The first portion 136 is configured from silicon nitride ($Si_3N_4$) or silicon oxide ($SiO_2$), for example. The second portion 137 is configured from silicon oxynitride (SiON) or silicon oxide, for example, and includes more oxygen than the first portion 136. A film thickness of the charge accumulation layer 124 is substantially identical for a portion corresponding to the first portion 136 and a portion corresponding to the second portion 137. Moreover, the first portion 136 is formed continuously in the Z direction. However, the first portion 136 may be separated in the Z direction as shown in FIG. 7. Moreover, as shown in FIG. 6, the first portion 136 is formed such that a width W1 in the Z direction gradually broadens from an outer side to a center side of the memory columnar body 105, and the second portion 137 is formed such that a width W2 in the Z direction gradually narrows from an outer side to a center side of the memory columnar body 105.

The block insulating layer 125 comprises: a third portion 138 contacting the first portion 136 of the charge accumulation layer 124; and a fourth portion 139 contacting the second portion 137 of the charge accumulation layer 124. The third portion 138 of the block insulating layer 125 is configured from a metal oxide layer of the likes of alumina ($Al_2O_3$). The fourth portion 139 is configured from a metal oxide layer of the likes of aluminum oxide ($AlO_x$), and includes more oxygen than the third portion 138. A film thickness of the third portion 138 of the block insulating layer 125 is larger than a film thickness of the fourth portion 139. Moreover, the third portion 138 and the fourth portion 139 of the block insulating layer 125 are provided alternately in the Z direction, corresponding to the first portion 136 and the second portion 137 of the charge accumulation layer 124.

The cover insulating layer 126 is configured from an insulating layer of the likes of silicon oxide ($SiO_2$), for example. The cover insulating layer 126 protects the block insulating layer 125 in a manufacturing step. The cover insulating layer 126 contacts the block insulating layer 125 and the stacked body LB.

The stacked body LB comprises the barrier metal layer 102a covering an upper surface, lower surface, and side surface of the conductive layer 102. The barrier metal layer 102a is configured from the likes of titanium (Ti) or titanium nitride (TiN), and suppresses diffusion of an impurity, and so on, in a manufacturing step. In addition, the stacked body LB comprises an oxide barrier layer 103 that covers upper surfaces and lower surfaces of the barrier metal layer 102a, the cover insulating layer 126, and the third portion 138 of the block insulating layer 125, and a side surface of the fourth portion 139 of the block insulating layer 125. The oxide barrier layer 103 is configured from the likes of silicon nitride ($Si_3N_4$) and suppresses oxidation of the conductive layer 102 or barrier metal layer 102a.

Now, the memory cell MC according to the present embodiment accumulates a charge in the charge accumulation layer 124 based on data to be recorded, and thereby records the data. Moreover, recorded data is determined by whether the memory cell MC attains an ON state, that is, whether a channel body (semiconductor layer 122) of the memory cell MC attains a conductive state, when a read voltage is applied to the control gate (conductive layer 102) of the memory cell MC. Now, for example, if a charge is accumulated in a portion of the charge accumulation layer 124 positioned between memory cells MC adjacent in the Z direction (for example, the portion indicated by "137" in FIG. 6), sometimes, a memory cell MC that should attain an ON state when applied with the read voltage ends up attaining an OFF state, and a misread ends up occurring.

Accordingly, in the present embodiment, the second portion 137 positioned between memory cells MC adjacent in the Z direction, of the charge accumulation layer 124 includes more oxygen than the first portion 136. In such a configuration, the number of trap levels of electrons in the second portion 137 of the charge accumulation layer 124 is fewer than the number of trap levels of electrons in the first portion 136. In other words, it is more difficult to accumulate a charge in the second portion 137 of the charge accumulation layer 124 compared to in the first portion 136. Therefore, in the present embodiment, it is possible to suppress the charge being accumulated in the second portion 137 of the charge accumulation layer 124, suppress that the charge being accumulated between memory cells MC adjacent in the Z direction, and suppress occurrence of a thereby caused misread.

Moreover, in the present embodiment, the block insulating layer 125 is formed from a metal oxide layer, and the fourth portion 139 includes more oxygen than the third portion 138. Such a configuration is formed by, for example, oxidizing part of the silicon nitride layer forming the charge accumulation layer 124 via the metal oxide layer of the likes of alumina ($Al_2O_3$) forming the block insulating layer 125, and forming the second portion 137 of the charge accumulation layer 124 and the fourth portion 139 of the block insulating layer 125. That is, in the present embodiment, a metal oxide layer of the likes of alumina ($Al_2O_3$) and not silicon oxide ($SiO_2$) is adopted as a material of the block insulating layer 125. As a result, the metal oxide layer can be caused to function as a catalyst during oxidation treatment of the charge accumulation layer 124, and the second portion 137 of the charge accumulation layer 124 can be preferably oxidized. Moreover, the metal oxide layer can be caused to function also as a barrier of an oxide material, whereby oxidation of the first portion 136 of the charge accumulation layer 124 can be preferably suppressed.

Note that the material of the block insulating layer 125 need not be an aluminum oxide ($AlO_x$) such as alumina ($Al_2O_3$), and need only be a metal oxide that functions as a catalyst during oxidation and has insulation. For example, titanium oxide ($TiO_x$), platinum oxide ($PtO_x$), hafnium oxide ($HfO_x$), zirconium oxide ($ZrO_x$), and so on, may be employed.

Moreover, in the present embodiment, the gap g is provided in the region R between the plurality of conductive layers 102 adjacent in the Z direction. In such a configuration, a step of filling an inter-layer insulating layer in the region R between the conductive layers 102 after oxidation treatment of the charge accumulation layer 124 can be omitted, whereby the number of processes can be reduced. In addition, electrostatic capacitance between the conductive layers 102 can be more reduced compared to the case where an inter-layer insulating layer is provided in the region R between the conductive layers 102.

Moreover, in the present embodiment, the first portion 136 of the charge accumulation layer 124 faces the conductive layer 102 via the block insulating layer 125 and the cover insulating layer 126. Therefore, by combining the block insulating layer 125 configured from a metal oxide layer whose permittivity is high and the cover insulating layer 126 whose permittivity is low, a distance and electrostatic capacitance between the conductive layer 102 and the charge accumulation layer 124 can be preferably adjusted.

Moreover, in the present embodiment, the block insulating layer 125 contacts the side surface of the charge accumulation layer 124. In other words, another layer is not provided between the block insulating layer 125 and the charge accumulation layer 124. Therefore, oxidation treatment of the charge accumulation layer 124 can be preferably performed.

Moreover, in the present embodiment, the upper surface and lower surface of the barrier metal layer 102a are covered by the oxide barrier layer 103. In such a configuration, the likes of oxidation of the conductive layer 102 can be prevented.

[Method of Manufacturing]

Figure 8:
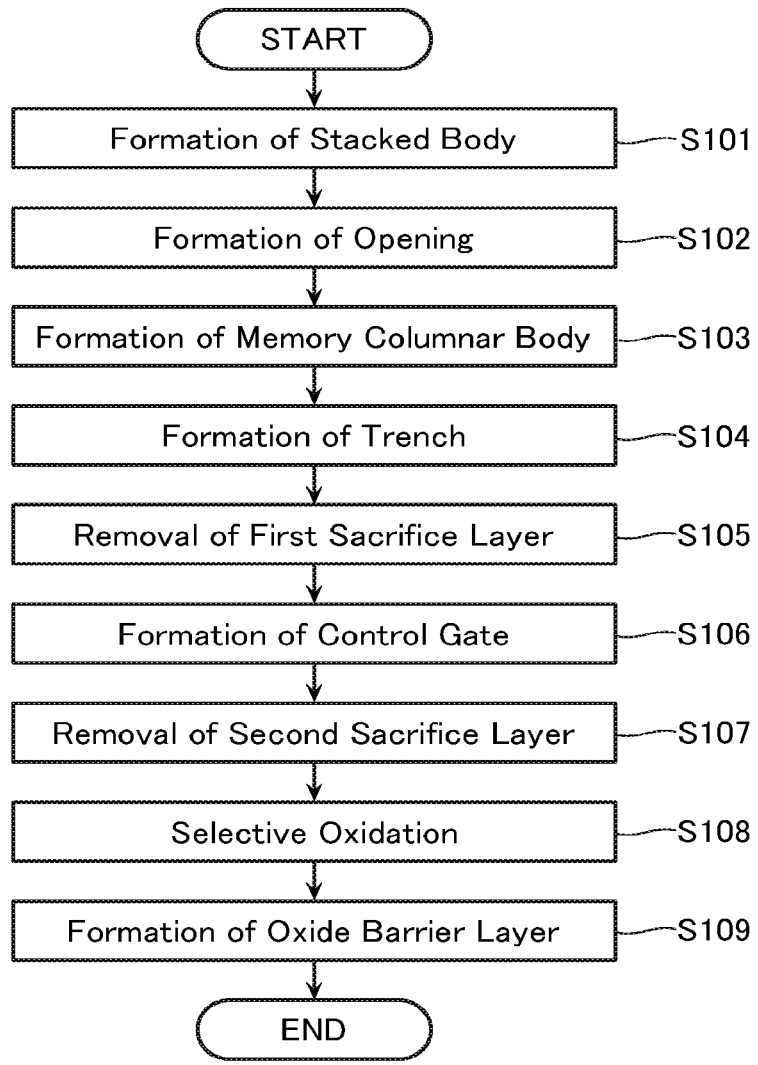
FIG. 8 is a flowchart for explaining a method of manufacturing the same nonvolatile semiconductor memory device.

Next, a method of manufacturing a nonvolatile semiconductor memory device according to the first embodiment will be described with reference to FIGS. 8 to 22. FIG. 8 is a flowchart for explaining the same method of manufacturing. FIGS. 9 to 22 are cross-sectional views for explaining the same method of manufacturing a nonvolatile semiconductor memory device.

Figure 9:
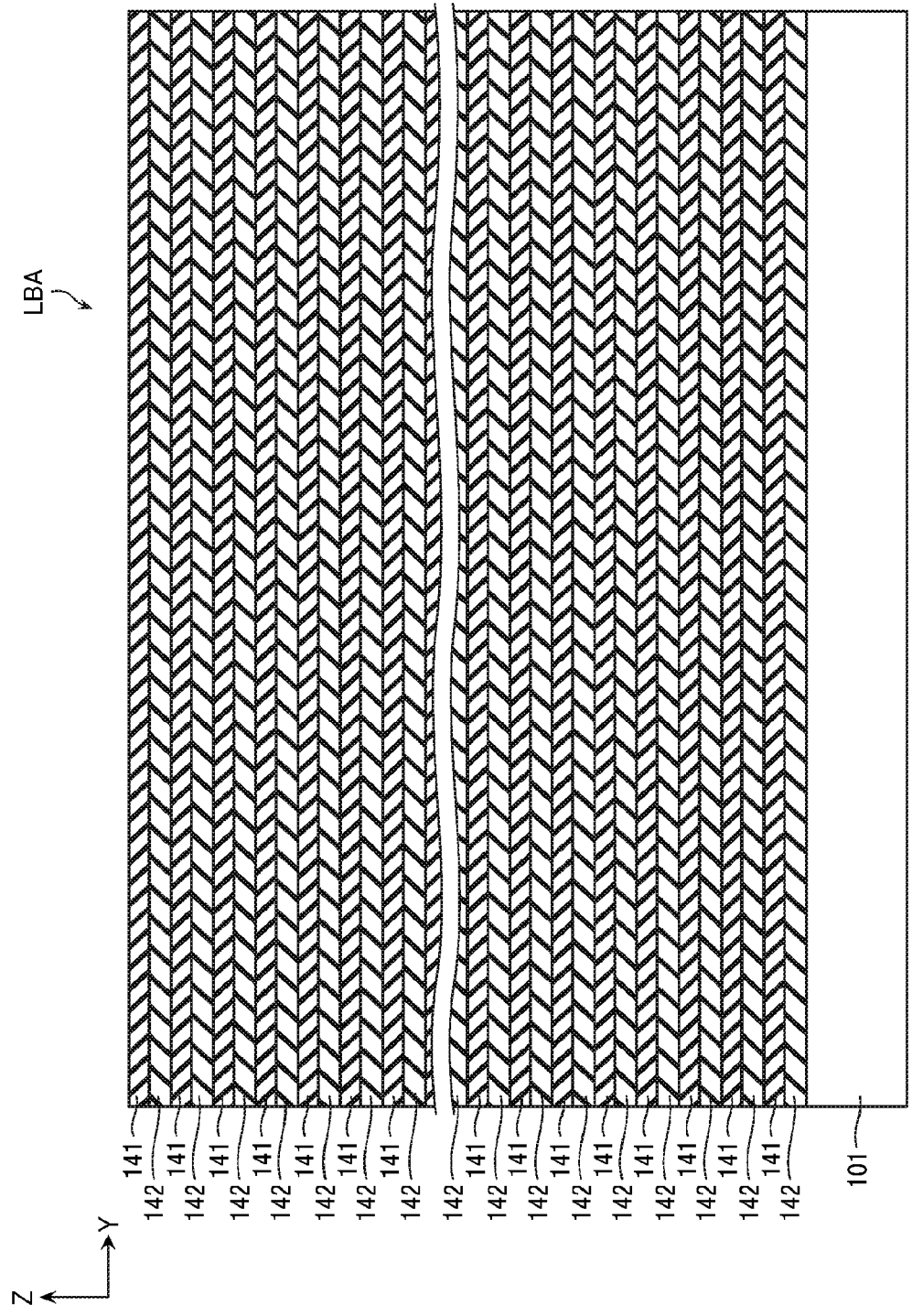
FIGS. 9 to 22 are cross-sectional views for explaining the same method of manufacturing.

As shown in FIGS. 8 and 9, in step S101, a stacked body LBA including a plurality of first sacrifice layers 141 and second sacrifice layers 142 is formed above the substrate 101. The first sacrifice layer 141 is formed by, for example, depositing an insulating layer of the likes of silicon oxide ($SiO_2$), by a method such as CVD (Chemical Vapor Deposition). The second sacrifice layer 142 is formed by depositing the likes of silicon nitride ($Si_2N_4$), for example, by a method such as CVD. Note that although here the first sacrifice layer 141 was formed from silicon oxide and the second sacrifice layer 142 was formed from silicon nitride, it is also possible, for example, for the first sacrifice layer 141 to be formed from silicon nitride and the second sacrifice layer 142 to be formed from silicon oxide. Moreover, the first sacrifice layer 141 and the second sacrifice layer 142 may be formed using a material other than silicon oxide or silicon nitride.

Figure 10:
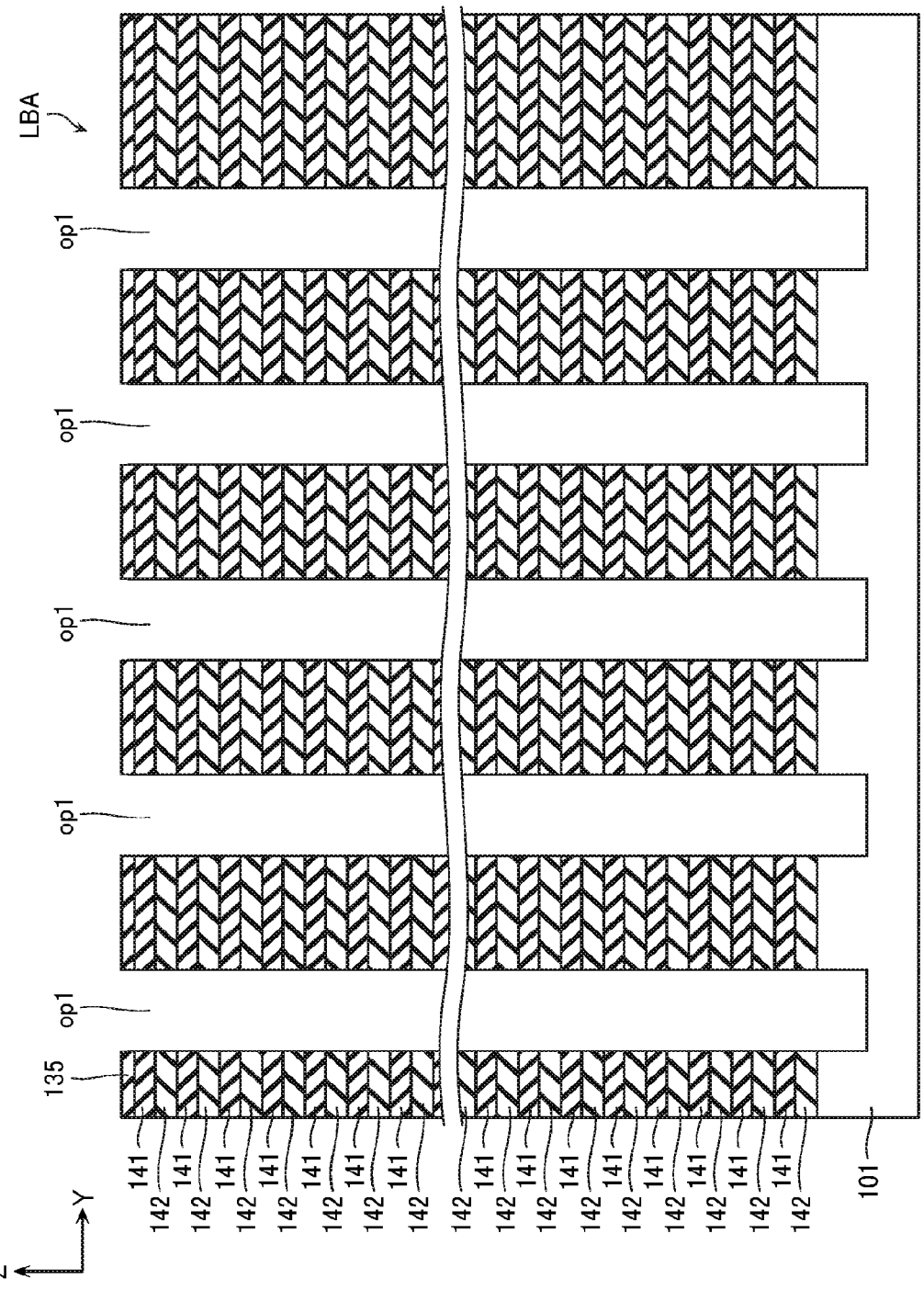

As shown in FIGS. 8 and 10, in step S102, an opening op1 (first opening) is formed in the stacked body LBA. The opening op1 is a through hole that extends in the Z direction and penetrates the plurality of first sacrifice layers 141 and second sacrifice layers 142 stacked above the substrate 101 to expose an upper surface of the substrate 101. The opening op1 is, for example, formed by a means such as RIE (Reactive Ion Etching) using as a mask the inter-layer insulating layer 135 having a through hole therein at a position corresponding to the opening op1.

Figure 11:
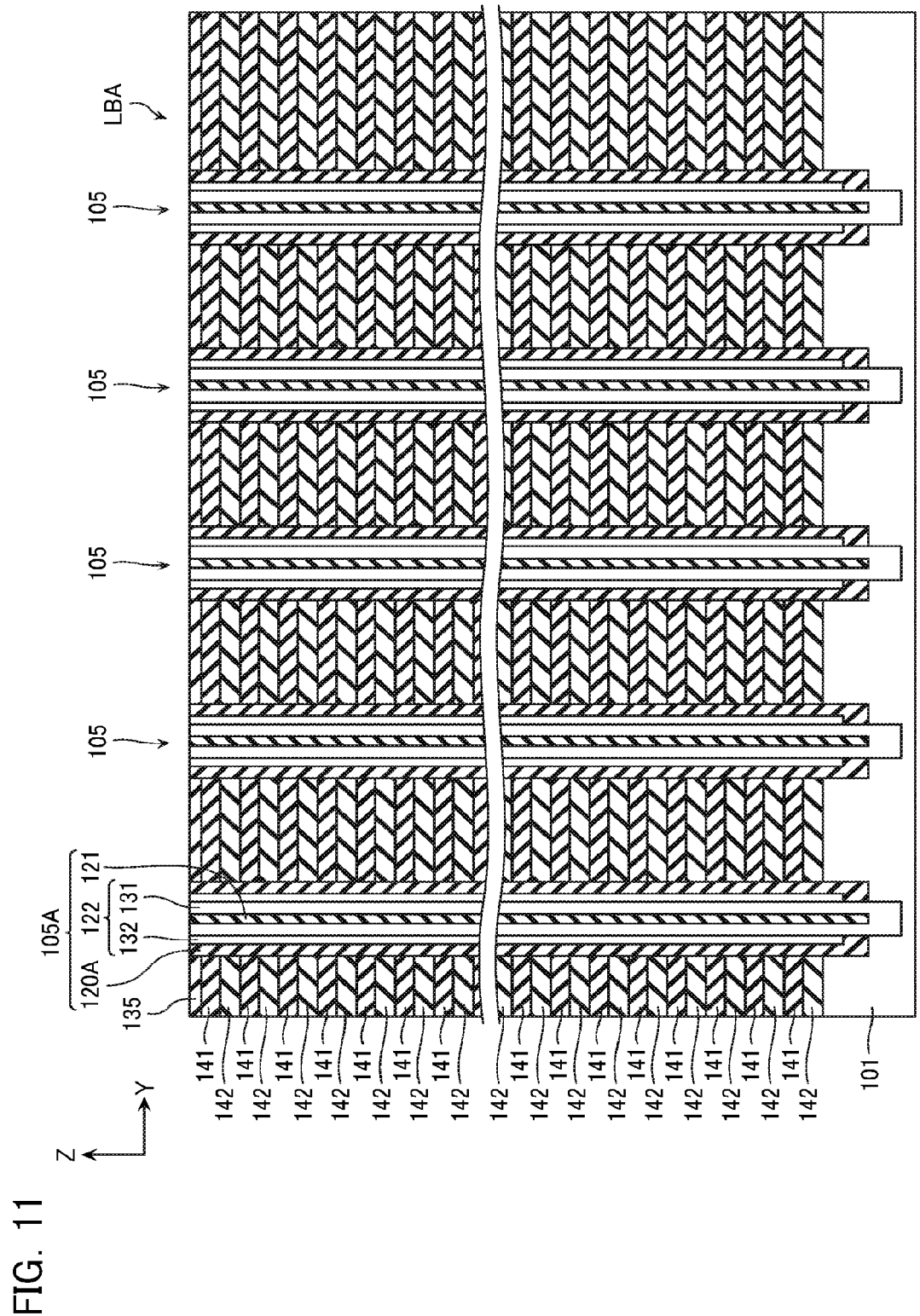
Figure 12:
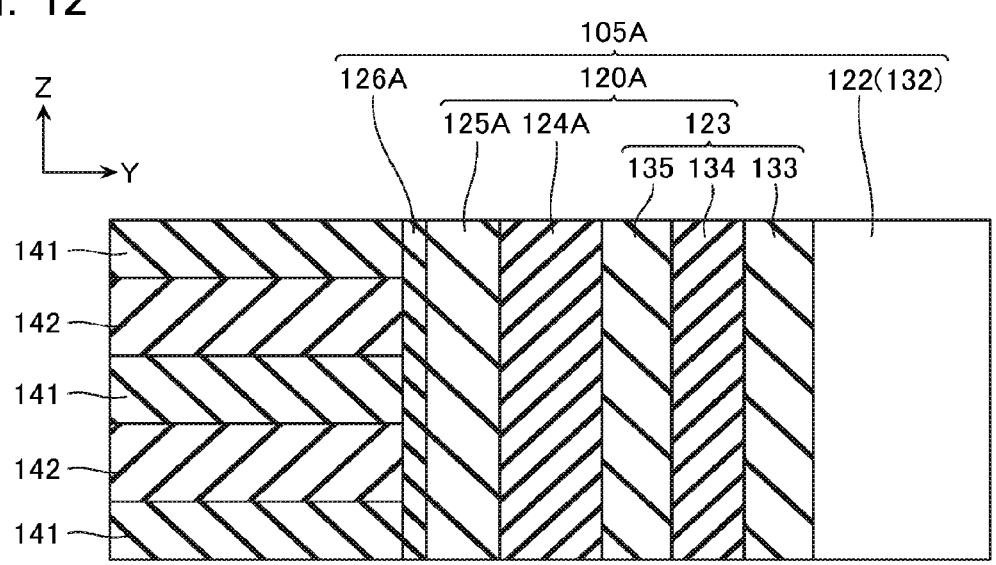

As shown in FIGS. 8, 11, and 12, in step S103, the memory columnar body 105 is formed inside the opening op1. For example, as shown in FIG. 12, the following layers are formed sequentially on a side surface of the opening op1, namely: a layer forming the cover insulating layer 126 (cover insulating layer formation layer 126A); a layer forming the block insulating layer 125 (block insulating layer formation layer 125A); a layer forming the charge accumulation layer 124 (charge accumulation layer formation layer 124A); the insulating layers 135, 134, and 133 configuring the tunnel insulating layer 123; and the second semiconductor layer 132 configuring the semiconductor layer 122. This formation is performed by a method such as CVD, for example. Moreover, as shown in FIG. 11, the first semiconductor layer 131 is formed by a method such as CVD and the core insulating layer 121 is implanted, inside the opening op1.

Note that the charge accumulation layer formation layer 124A is configured from an insulating layer capable of accumulating a charge, of the likes of silicon nitride ($Si_3N_4$), for example. The block insulating layer formation layer 125A is configured from a metal oxide layer having insulation, of the likes of alumina ($Al_2O_3$), for example. The cover insulating layer formation layer 126A is configured from an insulating layer of the likes of silicon oxide ($SiO_2$), for example.

Figure 13:
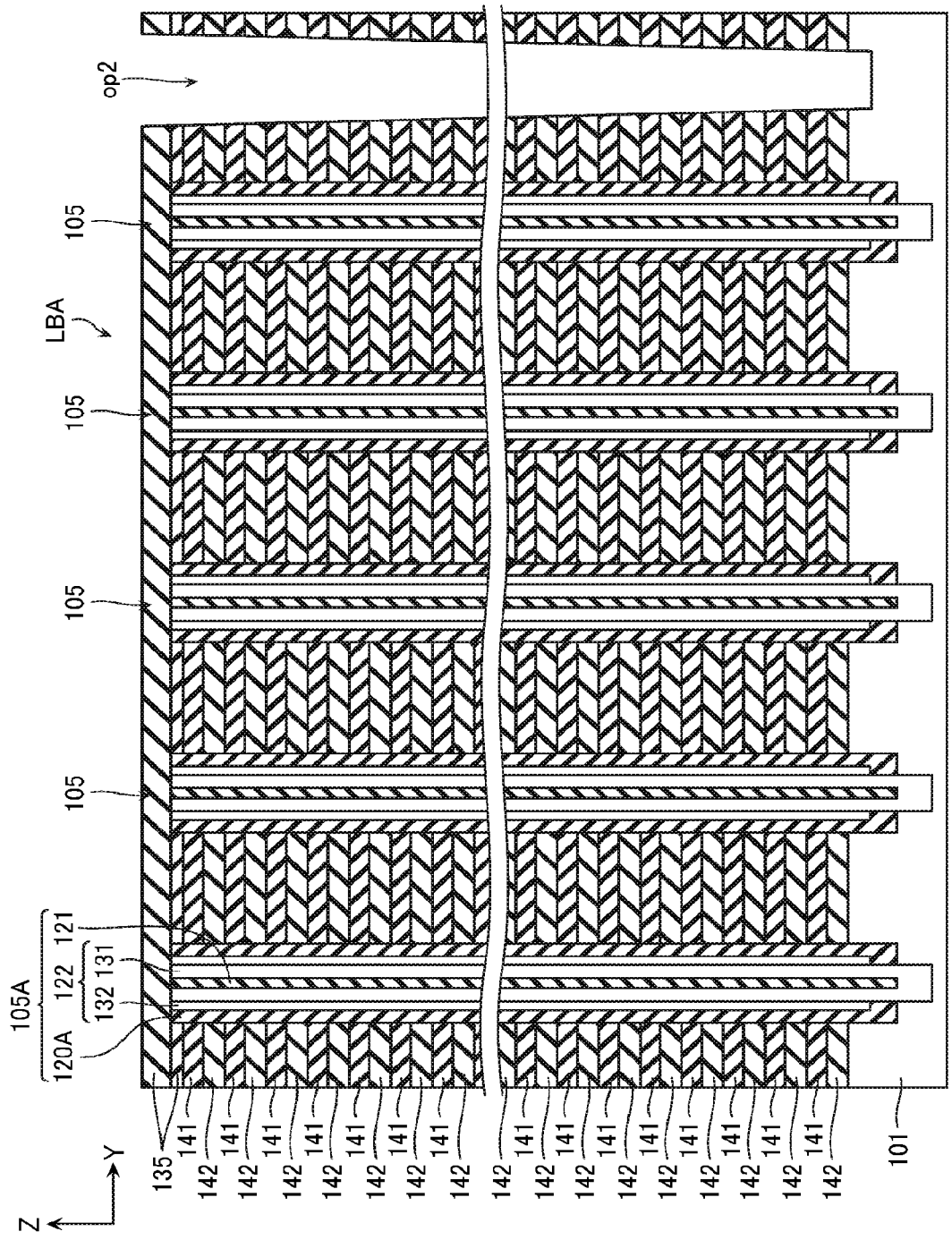

As shown in FIGS. 8 and 13, in step S104, a trench op2 (second opening) is formed. The trench op2 is a trench that, for example, extends in the Z direction and the X direction, and penetrates the plurality of first sacrifice layers 141 and second sacrifice layers 142 stacked above the substrate 101 to expose the upper surface of the substrate 101. The trench op2 is, for example, formed by a means such as RIE using as a mask the inter-layer insulating layer 135 having a trench therein at a position corresponding to the trench op2.

Figure 14:
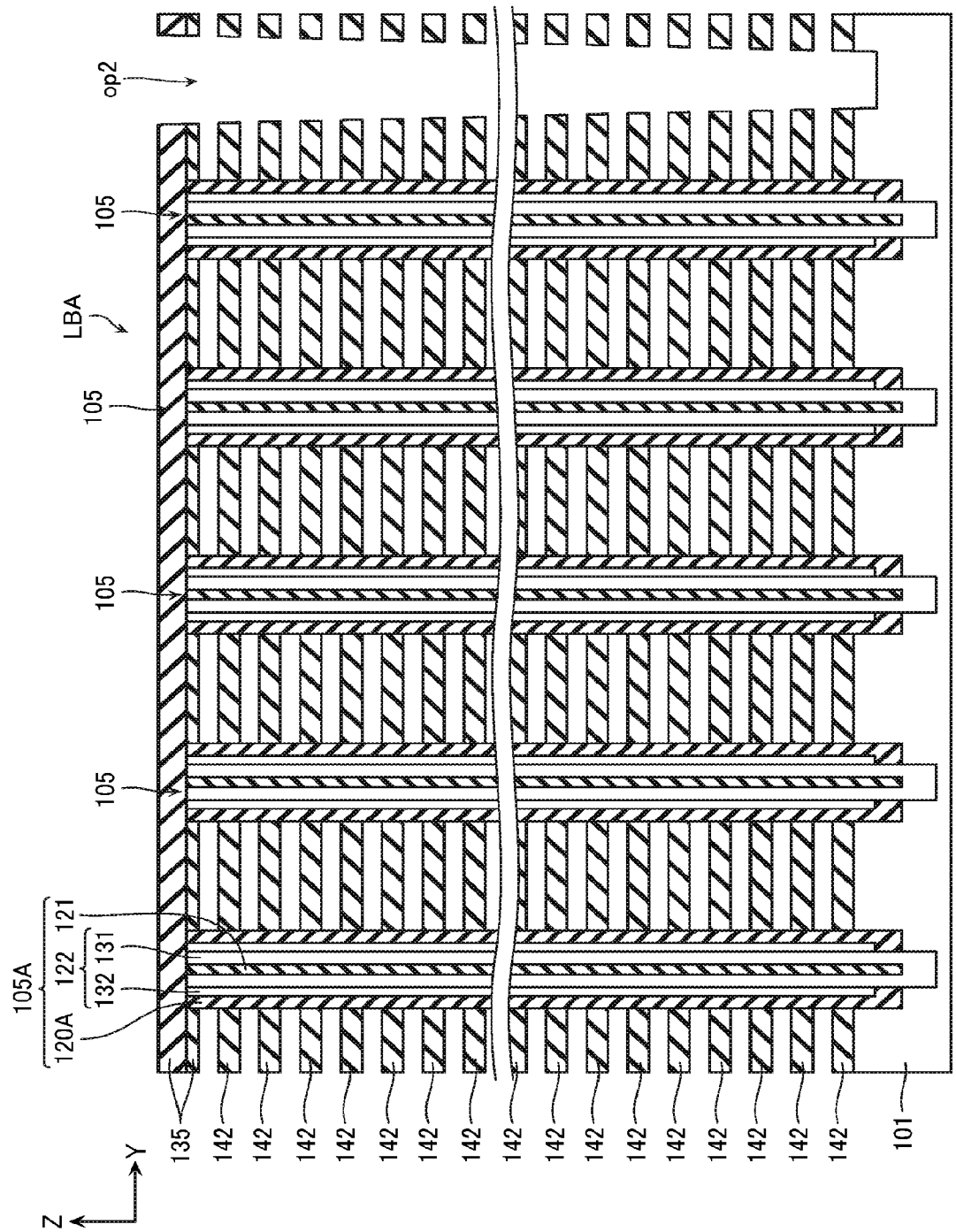
Figure 15:
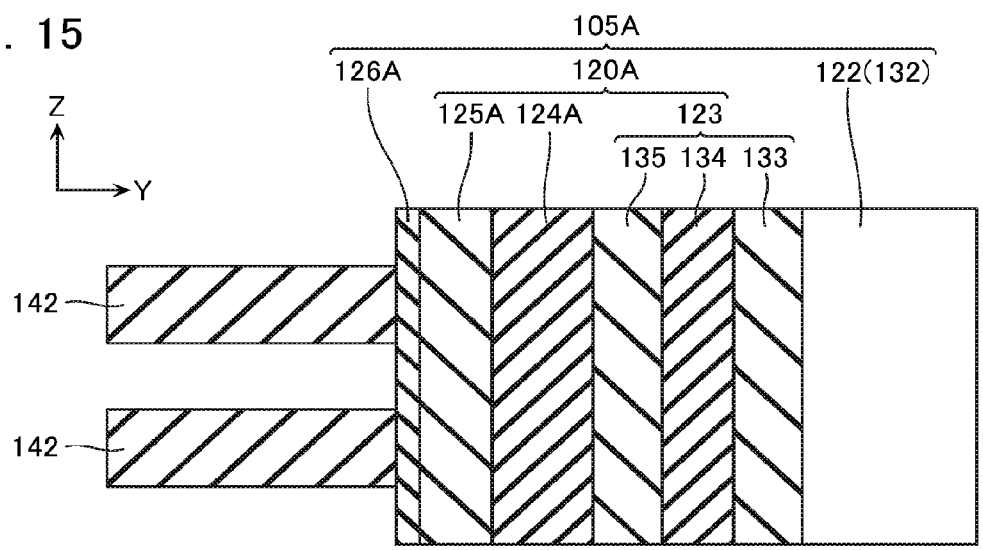

As shown in FIGS. 8, 14, and 15, in step S105, the first sacrifice layer 141 is removed. The first sacrifice layer 141 is removed by a means such as wet etching using the likes of hydrofluoric acid, for example. As a result, as shown in FIG. 15, an upper surface and lower surface of the second sacrifice layer 142 and a side surface of the cover insulating layer formation layer 126A are exposed in the trench op2.

Figure 16:
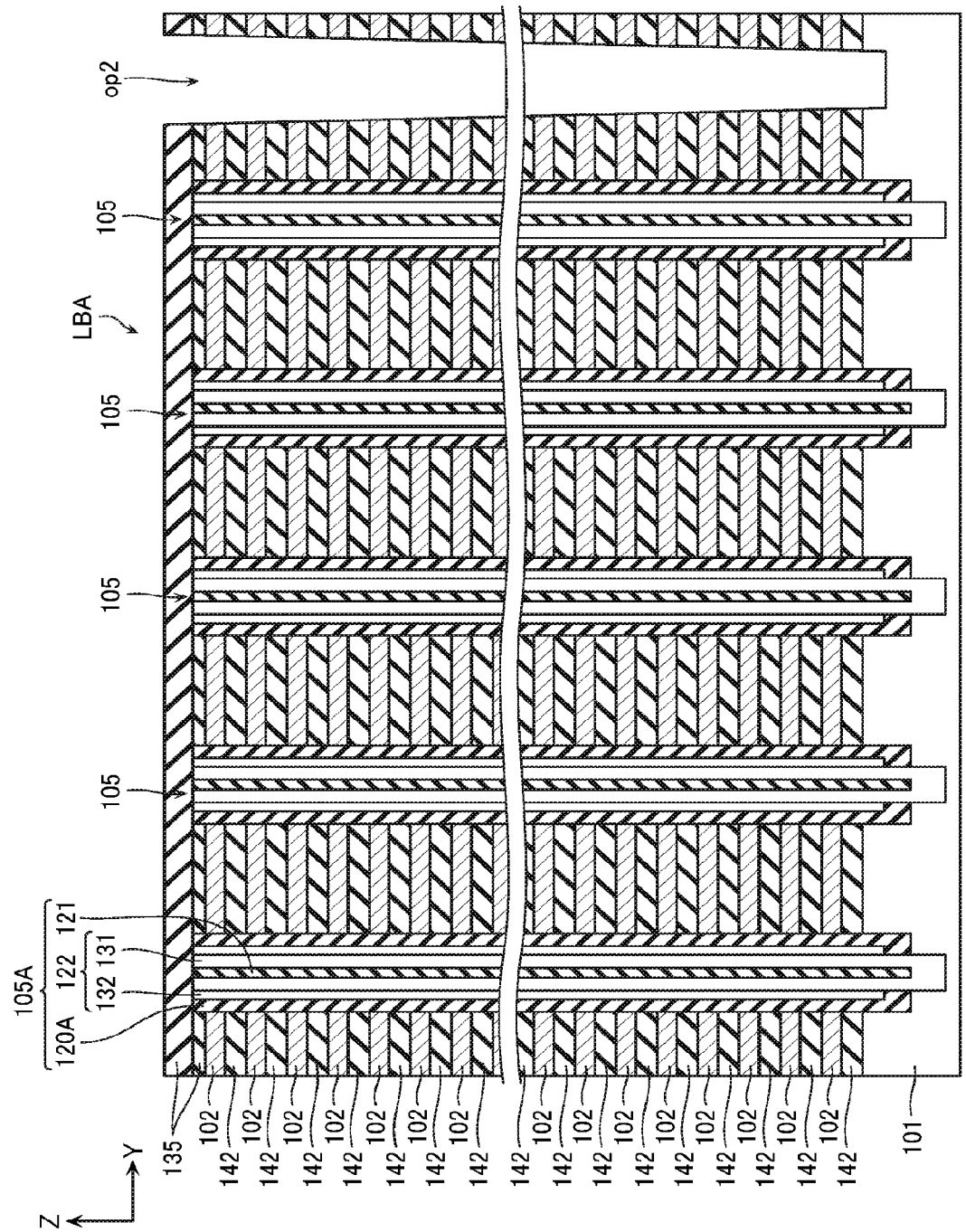
Figure 17:
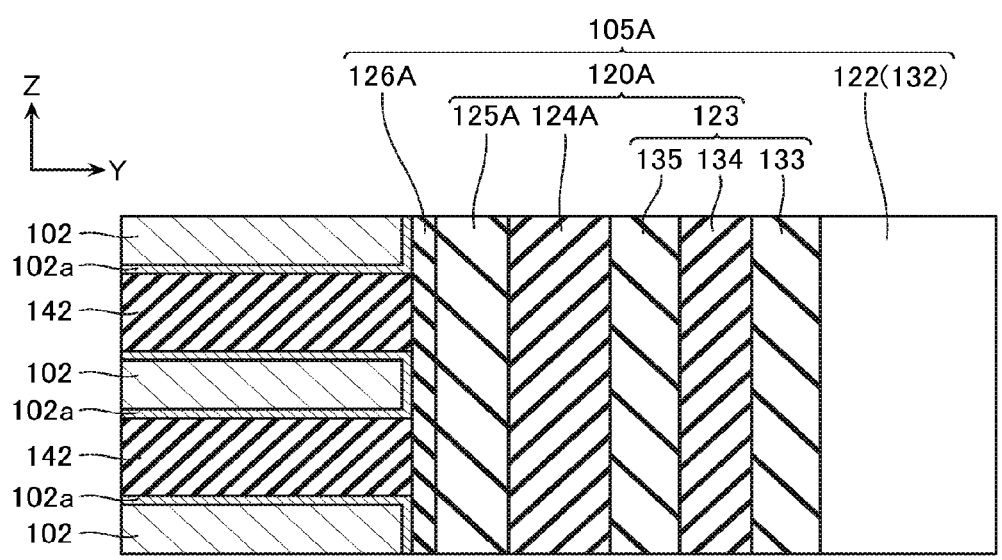

As shown in FIGS. 8, 16, and 17, in step S106, the conductive layer 102 functioning as the control gate of the memory cell MC, and so on, is formed. For example, as shown in FIG. 17, the barrier metal layer 102a and the conductive layer 102 are formed on the upper surface and lower surface of the second sacrifice layer 142 and on the side surface of the cover insulating layer formation layer 126A, via the trench op2. This formation is performed by a method such as CVD, for example. Note that, as shown in FIG. 16, portions formed on a side surface of the second sacrifice layer 142, of these barrier metal layer 102a and conductive layer 102, are removed.

Figure 18:
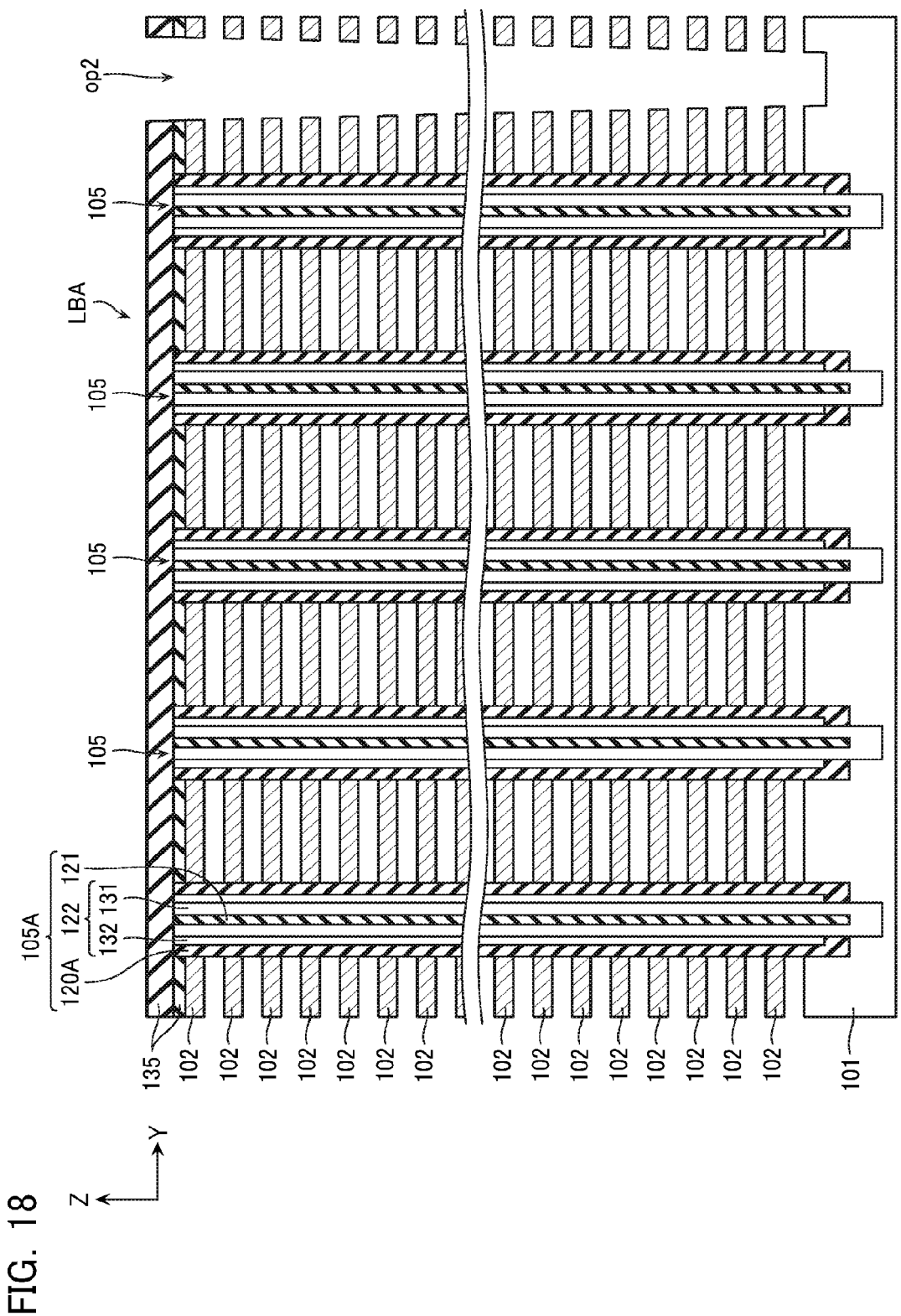
Figure 19:
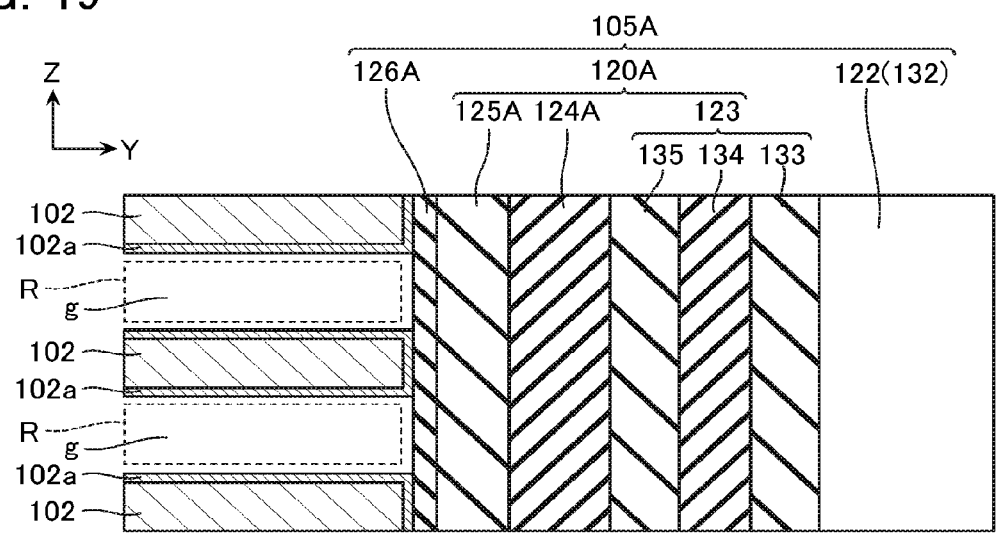

As shown in FIGS. 8, 18, and 19, in step S107, the second sacrifice layer 142 is removed. The second sacrifice layer 142 is removed by a means such as wet etching using the likes of phosphoric acid, for example. As a result, as shown in FIG. 19, the gap g is formed in the region R between conductive layers 102 adjacent in the Z direction, and an upper surface and lower surface of the barrier metal layer 102a and the side surface of the cover insulating layer formation layer 126A are exposed in the trench op2.

Figure 20:
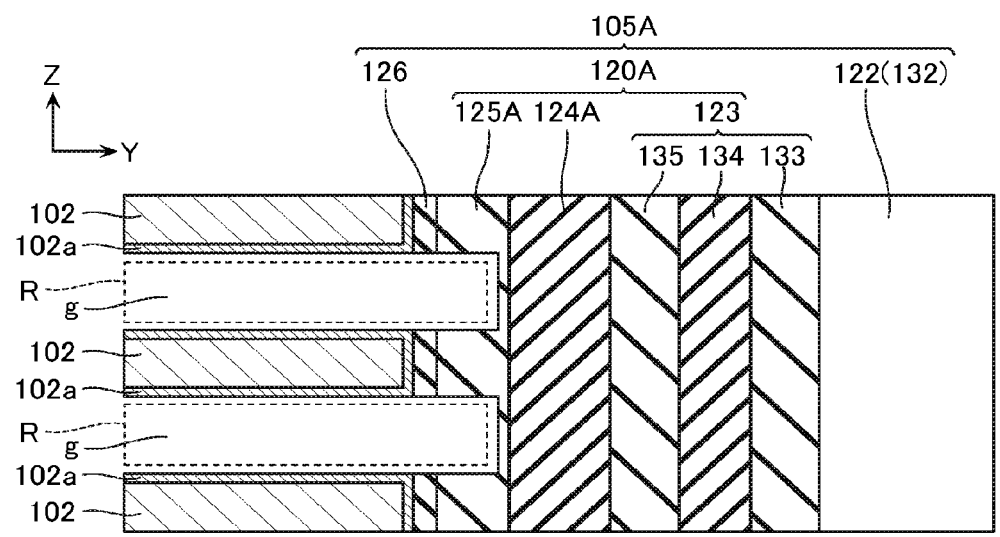
Figure 21:
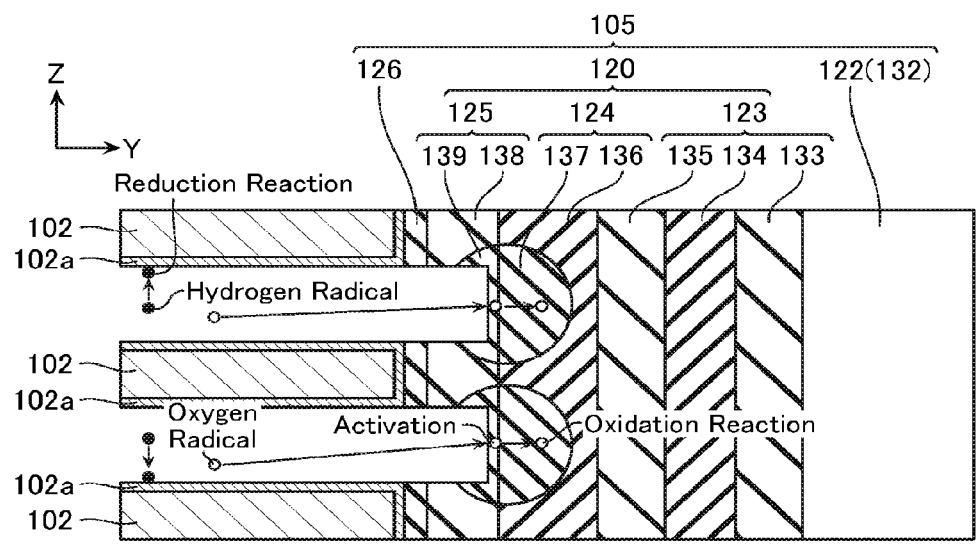

As shown in FIGS. 8, 20, and 21, in step S108, selective oxidation treatment is performed.

For example, as shown in FIG. 20, in step S108, parts of the cover insulating layer formation layer 126A and the block insulating layer formation layer 125A are removed. This step is performed by a means such as wet etching using the likes of hydrofluoric acid, for example. As a result, as shown in FIG. 20, a plurality of the cover insulating layers 126 divided in the Z direction are formed. In addition, a film thickness of part of the block insulating layer formation layer 125A decreases. Note that in the present embodiment, this step is performed such that the block insulating layer formation layer 125A is not divided in the Z direction (such that the charge accumulation layer formation layer 124A is not exposed in the trench op2).

Moreover, as shown in FIG. 21, in step S108, selective oxidation treatment is performed. This selective oxidation treatment is a step of selectively oxidizing part of the charge accumulation layer formation layer 124A without oxidizing the conductive layer 102 or barrier metal layer 102a. Employed in the selective oxidation treatment is, for example, plasma oxidation. In the plasma oxidation, for example, oxygen radicals and hydrogen radicals are supplied. As shown in FIG. 21, these oxygen radicals and hydrogen radicals are supplied to a side surface portion of the block insulating layer formation layer 125A or the upper surface and lower surface of the barrier metal layer 102a, via the trench op2. In the block insulating layer formation layer 125A, the oxygen radicals are activated by the metal oxide. The activated oxygen radicals penetrate inside the charge accumulation layer formation layer 124A and cause an oxidation reaction inside the charge accumulation layer formation layer 124A. As a result, the first portion 136 of the charge accumulation layer 124 and the second portion 137 including more oxygen than the first portion 136, of the charge accumulation layer 124, are formed. On the other hand, at the upper surface or lower surface of the barrier metal layer 102a, a reduction reaction due to the hydrogen radicals is more dominant than the oxidation reaction due to the oxygen radicals. Therefore, the conductive layer 102 or barrier metal layer 102a are not oxidized.

Figure 22:
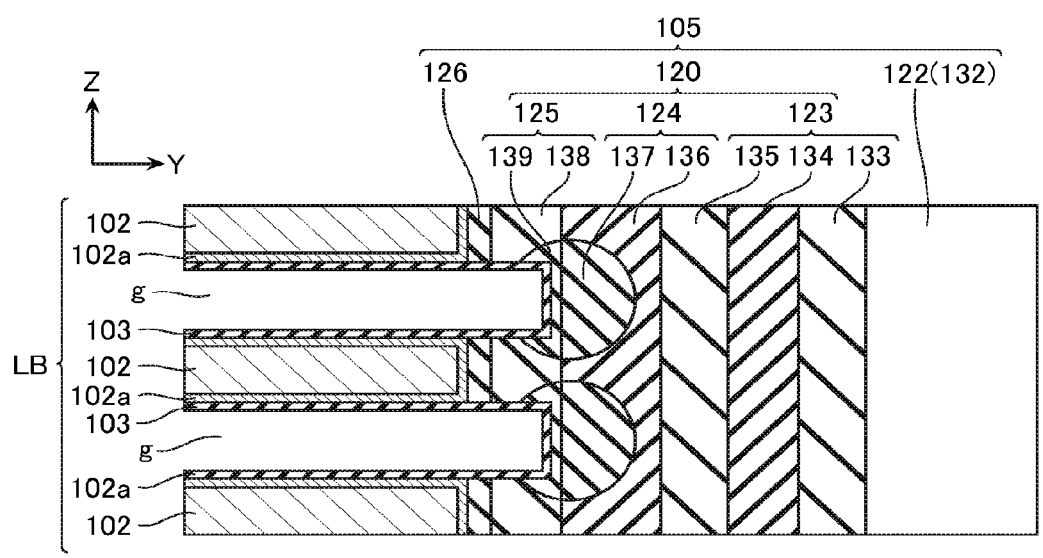

As shown in FIGS. 8 and 22, in step S109, the oxide barrier layer 103 covering the upper surfaces and lower surfaces of the barrier metal layer 102a, cover insulating layer 126, and third portion 138 of the block insulating layer 125, and side surface of the fourth portion 139 of the block insulating layer 125, is formed. The oxide barrier layer 103 may be formed by depositing the likes of silicon nitride ($Si_3N_4$) by a means such as CVD, or may be formed by performing the likes of nitridation treatment, for example.

Then, as shown in FIG. 5, the likes of the conductive layer 106 functioning as the bit line BL and the conductive layer 108 functioning as the source contact LI are formed, whereby the nonvolatile semiconductor memory device of the kind described with reference to FIGS. 5 and 6 can be manufactured.

Now, in the method according to the present embodiment, as described with reference to FIG. 21, part of the charge accumulation layer formation layer 124A is selectively oxidized via the block insulating layer formation layer 125A that includes a metal oxide. That is, part of the charge accumulation layer formation layer 124A is selectively oxidized in a state of being covered by the block insulating layer formation layer 125A. In such a method, the oxygen radicals can be activated by causing the metal oxide layer to function as a catalyst, whereby a portion corresponding to the second portion 137 of the charge accumulation layer formation layer 124A can be preferably oxidized. Moreover, the metal oxide layer can be caused to function also as a barrier to the oxygen radicals, whereby oxidation of a portion corresponding to the first portion 136 of the charge accumulation layer formation layer 124A can be preferably suppressed.

Moreover, in the method according to the present embodiment, as described with reference to FIG. 20, after removing the second sacrifice layer 142 and before performing selective oxidation treatment, part of the block insulating layer formation layer 125A is removed. This makes it possible to reduce a film thickness of a portion corresponding to the fourth portion 139, of the block insulating layer formation layer 125A, while securing a film thickness of a portion corresponding to the third portion 138, of the block insulating layer formation layer 125A. It is therefore possible to supply the oxygen radicals to a portion corresponding to the second portion 137 of the charge accumulation layer formation layer 124A while suppressing that the oxygen radicals reach a portion corresponding to the first portion 136 of the charge accumulation layer formation layer 124A.

Moreover, in the method according to the present embodiment, as shown in FIG. 12, the block insulating layer formation layer 125A is formed so as to contact the side surface of the charge accumulation layer formation layer 124A. Therefore, as shown in FIG. 21, during selective oxidation treatment, the oxygen radicals activated in the block insulating layer formation layer 125A directly penetrates inside the charge accumulation layer formation layer 124A without being mediated by another layer. It is therefore possible for an oxidation reaction to be caused in a comparatively deep portion (portion close to a center of the memory columnar body 105), of the charge accumulation layer formation layer 124A.

Moreover, in the method according to the present embodiment, as shown in FIG. 22, after selectively oxidizing part of the charge accumulation layer, the oxide barrier layer 103 covering the upper surface and lower surface of the conductive layer 102 is formed via the trench op2. Now, ozone or the like sometimes remains in the gap g between conductive layers 102 adjacent in the Z direction, whereby the conductive layer 102 or barrier metal layer 102a sometimes end up being oxidized. However, in the present embodiment, oxidation of the likes of the conductive layer 102 due to ozone or the like can be suppressed by the oxide barrier layer 103.

Moreover, in the method according to the present embodiment, as shown in FIG. 5, an inter-layer insulating layer is not implanted in the region R between conductive layers 102 adjacent in the Z direction, and the gap g is provide therein. In such a method, the step of filling an inter-layer insulating layer in the region R between the conductive layers 102 after oxidation treatment of the charge accumulation layer 124 can be omitted, whereby the number of processes can be reduced.

Second Embodiment

Figure 23:
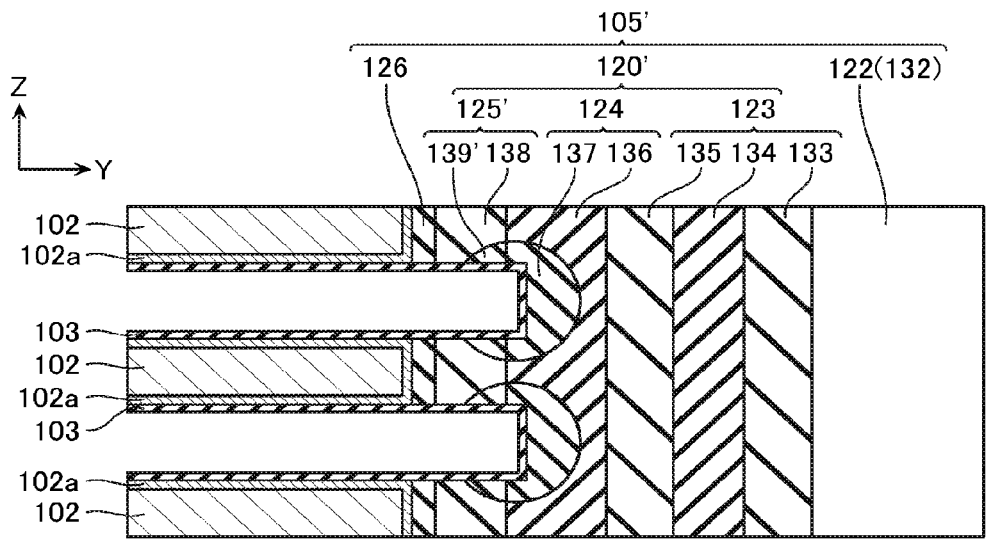
FIG. 23 is a cross view showing a configuration of part of a nonvolatile semiconductor memory device according to a second embodiment.

FIG. 23 is a cross-sectional view showing a configuration of part of a nonvolatile semiconductor memory device according to a second embodiment, and shows an enlarged view of a portion corresponding to the portion indicated by B in FIG. 5. Note that FIG. 23 is illustrated for explanation, and a specific configuration may be appropriately changed. Moreover, in the description below, portions similar to those of the first embodiment will be assigned with identical reference symbols to those assigned in the first embodiment, and descriptions thereof will be omitted.

In the present embodiment, a fourth portion 139' of a block insulating layer 125' is divided in the Z direction. In other respects, the nonvolatile semiconductor memory device according to the present embodiment is configured similarly to that of the first embodiment.

Figure 24:
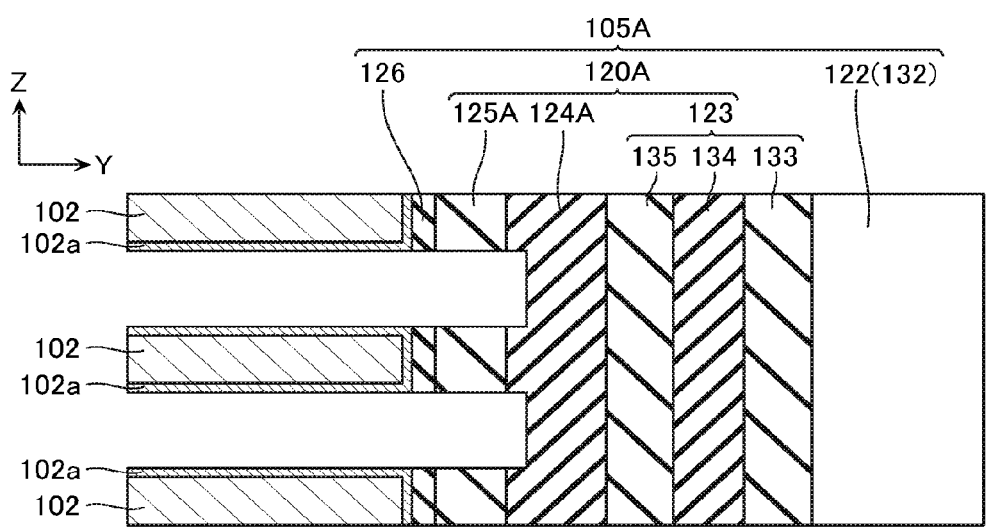
FIGS. 24 and 25 are cross-sectional views for explaining a method of manufacturing the same nonvolatile semiconductor memory device.
Figure 25:
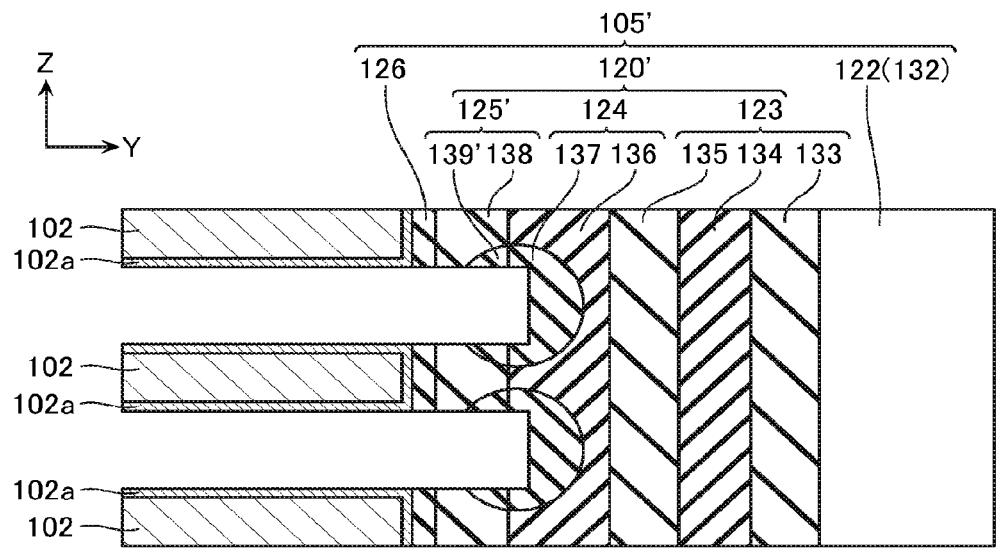

Next, a method of manufacturing a nonvolatile semiconductor memory device according to the second embodiment will be described with reference to FIGS. 24 and 25. FIGS. 24 and 25 are cross-sectional views for explaining the same method of manufacturing. Note that in the description below, portions similar to those of the first embodiment will be assigned with identical reference symbols to those assigned in the first embodiment, and descriptions thereof will be omitted.

The same method of manufacturing is performed similarly to that of the first embodiment up to the step described with reference to FIG. 19 (step S107).

In step S108 of the same method of manufacturing, first, as shown in FIG. 24, parts of the cover insulating layer formation layer 126A and the block insulating layer formation layer 125A are removed. This step is basically performed similarly to the step described with reference to FIG. 20, but in the present embodiment, as shown in FIG. 24, is performed such that the block insulating layer formation layer 125A is divided in the Z direction and the charge accumulation layer formation layer 124A is exposed in the trench op2.

Moreover, in step S108 of the same method of manufacturing, as shown in FIG. 25, selective oxidation treatment is performed. Plasma oxidation using the likes of oxygen radicals or hydrogen radicals is employed in this selective oxidation treatment, similarly to in the first embodiment, for example. Now, in the present embodiment, the oxygen radicals directly reach the charge accumulation layer formation layer 124A and oxidize a surface of the charge accumulation layer formation layer 124A. Moreover, some of the oxygen radicals that have reached the upper surface or lower surface of the block insulating layer formation layer 125A are activated and cause an oxidation reaction inside the charge accumulation layer 124A.

Then, similarly to in the first embodiment, the likes of the oxide barrier layer 103, the conductive layer 106 functioning as the bit line BL, and the conductive layer 108 functioning as the source contact LI, are formed.

Third Embodiment

Figure 26:
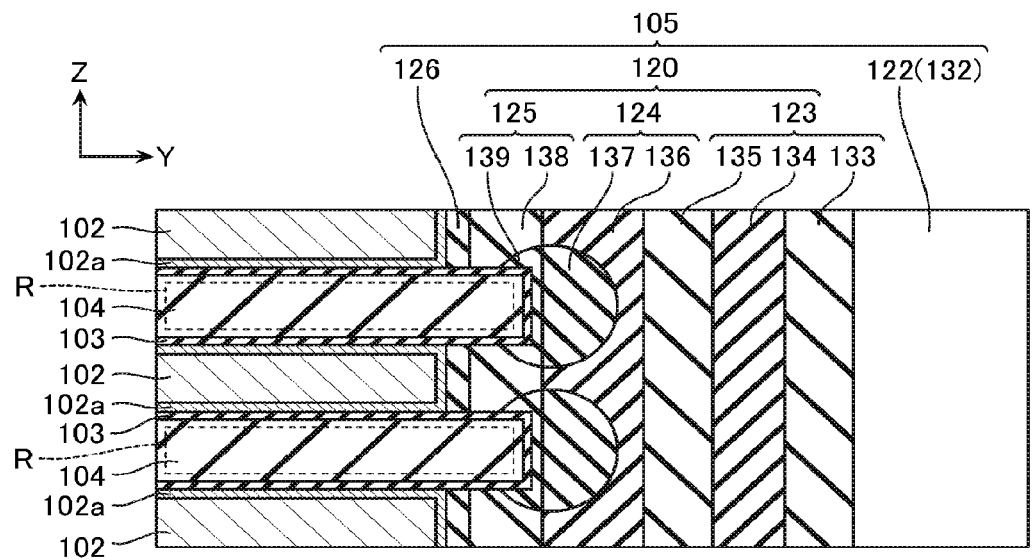
FIG. 26 is a cross-sectional view showing a configuration of part of a nonvolatile semiconductor memory device according to a third embodiment.

FIG. 26 is a cross-sectional view showing a configuration of part of a nonvolatile semiconductor memory device according to a third embodiment, and shows an enlarged view of a portion corresponding to the portion indicated by B in FIG. 5. Note that FIG. 26 is illustrated for explanation, and a specific configuration may be appropriately changed. Moreover, in the description below, portions similar to those of the first embodiment will be assigned with identical reference symbols to those assigned in the first embodiment, and descriptions thereof will be omitted.

In the present embodiment, the region R between the plurality of conductive layers 102 adjacent in the Z direction does not have the gap g therein, and is implanted with an inter-layer insulating layer 104. The inter-layer insulating layer 104 is configured from silicon oxide ($SiO_2$), for example. As a result, mechanical strength of the nonvolatile semiconductor memory device can be increased. In other respects, the nonvolatile semiconductor memory device according to the present embodiment is configured similarly to that of the first embodiment.

Note that the nonvolatile semiconductor memory device according to the present embodiment can be manufactured basically by a similar method to that of the first embodiment, but after the oxide barrier layer 103 has been formed in step S109 and before forming the likes of the bit line BL or source contact LI, the inter-layer insulating layer 104 is implanted in the region R between conductive layers 102 adjacent in the Z direction, via the trench op2.

Other Embodiments

As described with reference to FIG. 3, the lower end of the memory columnar body 105 according to the first embodiment is connected to the conductive layer 108 functioning as the source contact LI, via the substrate 101. However, the lower end of the memory columnar body 105 may be connected to the conductive layer 108 via a configuration other than the substrate 101.

Figure 27:
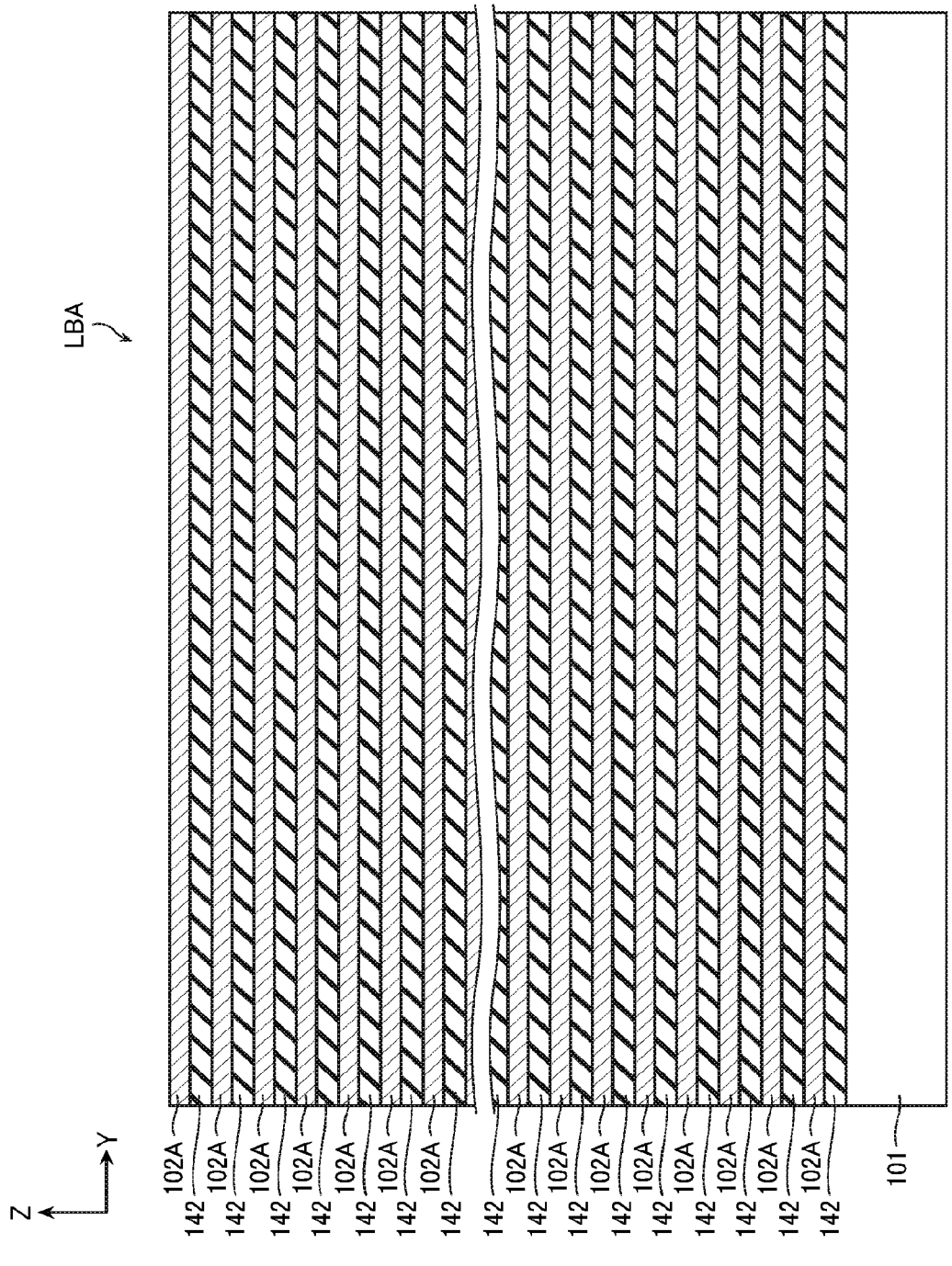
FIG. 27 is a cross-sectional view for explaining another method of manufacturing a nonvolatile semiconductor memory device according to an embodiment.

Moreover, as described with reference to FIG. 9, in the method of manufacturing according to the first embodiment, the stacked body LBA including the plurality of first sacrifice layers 141 (first layers) and second sacrifice layers 142 (sacrifice layers) is formed on the substrate 101. However, as shown in FIG. 27, a conductive layer 102A forming the conductive layer 102, of the likes of polysilicon or tungsten, may be directly formed as the first layer, instead of the first sacrifice layer 141. In this case, as shown in FIG. 16, the conductive layers 102 can be formed by forming the trench op2 to divide the first layers.

Others

While certain embodiments have been described, these embodiments have been presented by way of example only, and are not intended to limit the scope of the inventions. Indeed, the novel methods and systems described herein may be embodied in a variety of other forms: furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

What is claimed is:

1. A semiconductor memory device, comprising:
   a plurality of control gate electrodes stacked above a substrate;
   a semiconductor layer that extends n a first direction above the substrate and faces the plurality of control gate electrodes; and
   a gate insulating layer provided between the control gate electrodes and the semiconductor layer, the gate insulating layer comprising:
      a first insulating layer covering a side surface of the semiconductor layer;
      a charge accumulation layer covering a side surface of the first insulating layer and having a first portion and a second portion, the first portion facing one of the control gate electrodes, and the second portion facing a region between the control gate electrodes adjacent in the first direction and including more oxygen than the first portion; and
      a second insulating layer including a metal oxide, covering a side surface of the charge accumulation layer and having a third portion and a fourth portion, the third portion being provided between the one of the control gate electrodes and the first portion of the charge accumulation layer, and the fourth portion being provided between the region between the control gate electrodes and the second portion of the charge accumulation layer, and
   a film thickness of the third portion of the second insulating layer in a second direction crossing the first direction being larger than a film thickness of the fourth portion of the second insulating layer in the second direction.

2. The semiconductor memory device according to claim 1, wherein
   the third portion of the second insulating layer contacts the first portion of the charge accumulation layer,
   the fourth portion of the second insulating layer contacts the second portion of the charge accumulation layer, and
   the fourth portion of the second insulating layer includes more oxygen than the third portion of the second insulating layer.

3. The semiconductor memory device according to claim 1, wherein a gap is provided in the region between the control gate electrodes adjacent in the first direction.

4. The semiconductor memory device according to claim 1, further comprising a third insulating layer covering a side surface of the second insulating layer, the third insulating layer including silicon oxide, wherein
   the first portion of the charge accumulation layer faces one of the control gate electrodes via the second insulating layer and the third insulating layer.

5. The semiconductor memory device according to claim 1, wherein the second insulating layer contacts the side surface of the charge accumulation layer.

6. The semiconductor memory device according to claim 1, further comprising an oxide barrier layer covering an upper surface and lower surface of the control gate electrode.

* * * * *